US009007846B2

(12) United States Patent
Kaneko et al.

(10) Patent No.: US 9,007,846 B2
(45) Date of Patent: Apr. 14, 2015

(54) NON-VOLATILE SEMICONDUCTOR STORAGE DEVICE

(71) Applicant: Kabushiki Kaisha Toshiba Corporation, Tokyo (JP)

(72) Inventors: Akio Kaneko, Mie (JP); Wataru Sakamoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 13/758,119

(22) Filed: Feb. 4, 2013

(65) Prior Publication Data

US 2014/0043917 A1 Feb. 13, 2014

Related U.S. Application Data

(60) Provisional application No. 61/681,715, filed on Aug. 10, 2012.

(51) Int. Cl.
*G11C 16/04* (2006.01)
*G11C 16/16* (2006.01)
*G11C 16/06* (2006.01)
*G11C 16/14* (2006.01)

(52) U.S. Cl.
CPC .............. *G11C 16/16* (2013.01); *G11C 16/06* (2013.01); *G11C 16/0483* (2013.01); *G11C 16/14* (2013.01)

(58) Field of Classification Search
CPC .. G11C 16/344; G11C 16/3445; G11C 16/16; G11C 16/14
USPC ............ 365/185.29, 185.33, 185.17, 185.26, 365/185.22
See application file for complete search history.

(56) References Cited

U.S. PATENT DOCUMENTS 7,855,912 B2 * 12/2010 Lee et al. ................. 365/185.03
8,339,862 B2 * 12/2012 Aiika et al. ............. 365/185.23
2003/0133329 A1   7/2003 Satoh

FOREIGN PATENT DOCUMENTS

JP          7-320487      12/1995
JP        2007-128645      5/2007
WO         98/18132       4/1998

* cited by examiner

*Primary Examiner* — David Lam
(74) *Attorney, Agent, or Firm* — Oblon, McClelland, Maier & Neustadt, L.L.P.

(57) ABSTRACT

According to one embodiment, there is provided a non-volatile semiconductor storage device including a memory cell and a control unit. The memory cell has a gate electrode including a control gate and a charge storage region on a semiconductor substrate and has a channel region under the gate electrode in the semiconductor substrate. The control unit, during an erase operation where electric charges written in the charge storage region are extracted to the channel region, periodically varies a voltage which is to be applied between the control gate and the channel region.

19 Claims, 18 Drawing Sheets

NON-WRITTEN MEMORY CELL

WRITTEN MEMORY CELL

NON-WRITTEN MEMORY CELL

WRITTEN MEMORY CELL

NON-WRITTEN MEMORY CELL

WRITTEN MEMORY CELL

NON-WRITTEN MEMORY CELL

WRITTEN MEMORY CELL

NON-VOLATILE SEMICONDUCTOR STORAGE DEVICE

CROSS-REFERENCE TO RELATED APPLICATIONS

This application is based upon and claims the benefit of priority from Nonprovisional Application Ser. No. 61/681,715, filed on Aug. 10, 2012; the entire contents of which are incorporated herein by reference.

FIELD

Embodiments described herein relate generally to a non-volatile semiconductor storage device.

BACKGROUND

In a memory cell of a non-volatile semiconductor storage device, for example, during a data write period, electric charges are written from a semiconductor substrate through a tunnel insulating film to a charge storage region; and for example, during a data erase period, electric charges are extracted from the charge storage region through the tunnel insulating film to the semiconductor substrate. Since stress may be exerted to the tunnel insulating film every time when the electric charges pass through the tunnel insulating film, the tunnel insulating film may be deteriorated. Therefore, it is preferable to improve reliability of the non-volatile semiconductor storage device.

DETAILED DESCRIPTION

In general, according to one embodiment, there is provided a non-volatile semiconductor storage device including a memory cell and a control unit. The memory cell has a gate electrode including a control gate and a charge storage region on a semiconductor substrate and has a channel region under the gate electrode in the semiconductor substrate. The control unit, during an erase operation where electric charges written in the charge storage region are extracted to the channel region, periodically varies a voltage which is to be applied between the control gate and the channel region.

Exemplary embodiments of a non-volatile semiconductor storage device will be explained below in detail with reference to the accompanying drawings. The present invention is not limited to the following embodiments.

First Embodiment

Figure 1:
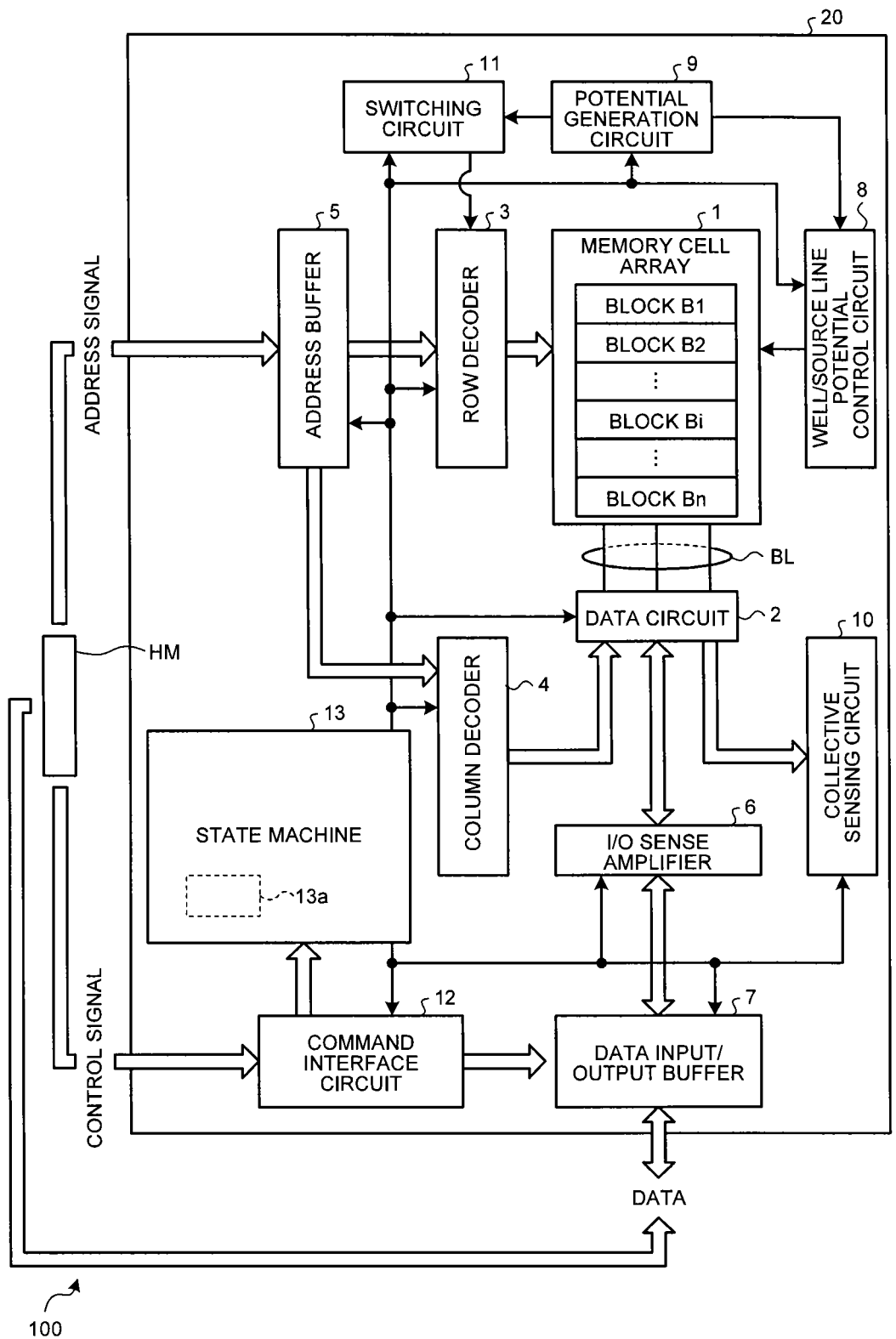
FIG. 1 is a schematic diagram illustrating a configuration of a non-volatile semiconductor storage device according to a first embodiment.
Figure 2:
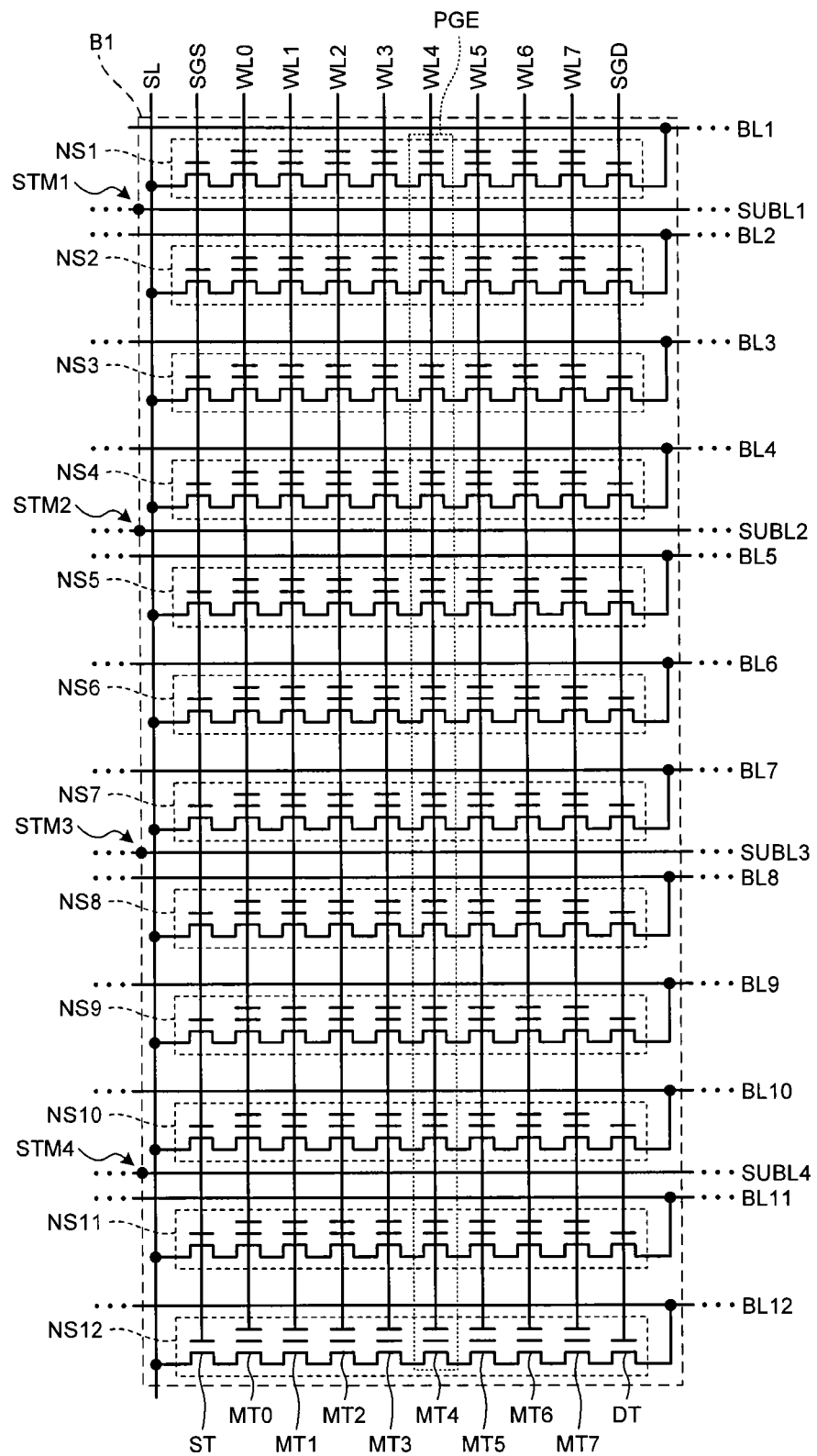
FIG. 2 is a diagram illustrating a configuration of a memory cell array according to the first embodiment.

A non-volatile semiconductor storage device 100 according to a first embodiment will be described with reference to FIGS. 1 and 2. FIG. 1 is a schematic diagram illustrating a configuration of the non-volatile semiconductor storage device 100. FIG. 2 is a diagram illustrating a configuration of one block in a memory cell array 1 of the non-volatile semiconductor storage device 100.

As illustrated in FIG. 1, the non-volatile semiconductor storage device 100 includes a memory chip 20. The memory chip 20 includes a memory cell array 1, a data circuit 2, a row decoder 3, a column decoder 4, an address buffer 5, an I/O sense amplifier 6, a data input/output buffer 7, a well/source line potential control circuit 8, a potential generation circuit 9, a switching circuit 11, a collective sensing circuit 10, a command interface circuit 12, and a state machine 13.

In the memory cell array 1, a plurality of memory cells are arrayed to constitute a plurality of rows and a plurality of columns. For example, the memory cell array 1 includes n blocks B1 to Bn (n is a positive integer). For example, as illustrated in FIG. 2, the plurality of the NAND strings NS1 to NS12 are disposed in each of the blocks B1 to Bn. For example, the plurality of the NAND strings NS1 to NS12 are extended in the column direction respectively and arrayed in the row direction. For example, each of the NAND strings NS1 to NS12 includes a plurality of memory cells MT0 to MT7 which are connected in series and two selection gates ST and DT which are connected to both ends thereof (refer to FIG. 2).

A plurality of word lines are extended in the row direction respectively and arrayed in the column direction. For example, as illustrated in FIG. 2, the plurality of the word lines WL0 to WL7 are extended in the row direction respectively and arrayed in the column direction. In other words, each of the word lines WL0 to WL7 is extended so as to intersect the plurality of the NAND strings NS1 to NS12 and to be connected to the control gates of the memory cells.

A plurality of bit lines are extended in the column direction respectively and arrayed in the row direction. For example, as illustrated in FIG. 2, a plurality of a bit lines BL1 to BL12 are extended in the column direction respectively and arrayed in the row direction. In other words, the plurality of the bit lines BL1 to BL12 correspond to the plurality of the NAND strings NS1 to NS12.

The data circuit 2 includes a plurality of latches (storage circuits). The data circuit 2 temporarily stores, for example, 4-bit (16 values) write data during a write period and, for example, 4-bit (16 values) read data during a read period. Therefore, at least, for example, six latches are installed for one bit line BL connected to a memory cell which is selected as an object of write/read operations. One of the six latches stores logic lower page data, and another stores logic upper page data.

The row decoder 3 includes a row address decoder and a word line driver. The row decoder 3 selects a row in the memory cell array 1 based on the operation mode (write, read, erase, or the like) and an address indicated by a row address signal and control potentials of a plurality of word lines in the memory cell array 1 to be predetermined potentials.

For example, during the write period, the row decoder 3 sets a potential of a selected word line corresponding to a selected memory cell to a transfer potential Vpass (for example, about 10 V) or sets the potential to the program potential Vpgm (for example, about 18 V).

In addition, for example, during the erase period, the row decoder 3 controls the potential of the plurality of word lines corresponding to the plurality of memory cells in a to-be-erased block under the control of a control unit 13a of the state machine 13.

The column decoder 4 includes a column address decoder and a bit line driver. The column decoder 4 selects a column in the memory cell array 1 based on the operation mode (write, read, erase, or the like) and an address indicated by a column address signal and control potentials of a plurality of bit lines in the memory cell array 1 to be predetermined potentials. During the write period, write data is input through the data input/output buffer 7 and the I/O sense amplifier 6 to a storage circuit in the data circuit 2 included in the selected column. For example, during the write period, the column decoder 4 sets a potential of a selected bit line corresponding to a selected memory cell to a selection potential (for example, 0 V) and sets a potential of a non-selected bit line to a non-selection potential (for example, 3 V).

In addition, during the read period, read data is temporarily stored in a storage circuit in the data circuit 2 included in a selected column, and after that, the read data are output through the I/O sense amplifier 6 and the data input/output buffer 7 to an external portion of the memory chip 20.

Among the address signals, the row address signal is input through the address buffer 5 to the row decoder 3. The column address signal is input through the address buffer 5 to the column decoder 4.

The well/source line potential control circuit 8 controls potentials of a plurality of well regions (example, double well regions configured with n-well and p-well) and potentials of source lines corresponding to the blocks B1 to Bn according to the operation mode (write, read, erase, or the like). For example, during the erase (erase operation) period in which each of the blocks B1 to Bn is set as a unit of erasing, the well/source line potential control circuit 8 controls potentials of a plurality of well regions corresponding to a to-be-erased block through substrate contacts (refer to the substrate contacts STM1-1 to STM4-n illustrated in FIG. 3) under the control of the control unit 13a of the state machine 13.

For example, during the write period, the potential generation circuit 9 generates the program potential Vpgm (for example, about 18 V) or the transfer potential Vpass (for example, about 10 V), and the like. The program potential Vpgm and the transfer potential Vpass are distributed to a plurality of word lines in one or two or more selected blocks selected from the blocks B1 to Bn by the switching circuit 11.

In addition, for example, during the erase period, the potential generation circuit 9 generates predetermined potentials (gate voltages). Next, the predetermined potentials (gate voltages) are distributed to word lines corresponding to one or two or more selected blocks selected from the blocks B1 to Bn by the switching circuit 11. The row decoder 3 supplies the gate voltages to control gates of the memory cells of the to-be-erased block through a plurality of word lines corresponding to the to-be-erased block.

In addition, for example, during the erase period the potential generation circuit 9 generates predetermined potentials. Next, for example, the well/source line potential control circuit 8 supplies back-gate voltages to one or two or more well regions (both of the n-well and the p-well) corresponding to one or two or more selected blocks selected as to-be-erased blocks from the blocks B1 to Bn through substrate voltage lines (for example, refer to substrate voltage lines SUBL1 to SUBL4 illustrated in FIG. 3).

The collective sensing circuit 10 verifies whether or not predetermined data is written accurately in a memory cell during the write period and verifies whether or not data is erased completely from a memory cell during the erase period (verifying operation).

The command interface circuit 12 determines based on a control signal generated by a chip (for example, a host microcomputer or a memory controller HM) different from the memory chip 20 whether or not data input to the data input/output buffer 7 is command data supplied from the host microcomputer. In the case where the data input to the data input/output buffer 7 is command data, the command interface circuit 12 transmits the command data to the state machine 13.

The state machine 13 determines the operation mode (write, read, erase, or the like) of a NAND flash memory based on the command data and controls the entire operations of the NAND flash memory, specifically, the operations of the data circuit 2, the row decoder 3, the column decoder 4, the address buffer 5, the I/O sense amplifier 6, the data input/output buffer 7, the well/source line potential control circuit 8, the potential generation circuit 9, the switching circuit 11, and the collective sensing circuit 10 according to the operation mode.

For example, the state machine 13 includes a control unit 13a as a configuration relating to erase control. In the erase operation, the control unit 13a controls the potential generation circuit 9, the switching circuit 11, and the row decoder 3 so as for predetermined gate voltages to be supplied to the control gates of the memory cells in the to-be-erased block through the plurality of the word lines. In addition, in the erase operation, the control unit 13a controls the potential generation circuit 9 and the well/source line potential control circuit 8 so as for predetermined back-gate voltages to be supplied to the channel regions of the memory cells in the to-be-erased block through the substrate contacts. In addition, the operations of the control unit 13a will be described in detail.

Next, a schematic configuration of the memory cell array 1 will be described with reference to FIG. 2. Although FIG. 2 exemplarily illustrates one block B1 among the plurality of the blocks B1 to Bn included in the memory cell array 1, the other blocks B2 to Bn also have similar illustration to that of the block B1.

In FIG. 2, for example, eight word lines WL0 to WL7, selection gate lines SGD and SGS, and a source line SL are installed in the block B1. In addition, for example, twelve bit lines BL1 to BL12 are commonly installed in the blocks B1 to Bn. In addition, although FIG. 2 exemplarily illustrates the case where eight word lines and twelve bit lines are installed, the number of word lines and the number of bit lines are not limited to the above numbers.

In the block B1, twelve NAND strings NS1 to NS12 are arranged in the row direction, and the NAND strings NS1 to NS12 correspond to the bit lines BL1 to BL12 to be connected to the corresponding bit lines BL1 to BL12.

The memory cells MT0 to MT7 and the selection gates DT and ST are installed in the column direction in the NAND strings NS1 to NS12. Each of the memory cells MT0 to MT7 is, for example, one transistor. In addition, the memory cells MT0 to MT7 are connected in series. In addition, for example, as illustrated in the memory cell MT0-1 of FIG. 18, each of the memory cells MT0 to MT7 includes a gate electrode 30, where a tunnel insulating film 31, a charge storage region 32, an insulating film 33, and a control gate 34 are stacked in this order, on a semiconductor substrate SB, includes a channel region 60 under the gate electrode 30 in the semiconductor substrate SB, and includes a source region 40 and a drain region 50 on both sides of the channel region 60 in the semiconductor substrate SB. The charge storage region 32 is, for example, a floating gate or an ONO film.

For example, in the case where electric charges which are to be written in the charge storage region 32 (for example, electrons) correspond a first conductivity type (for example, N-type), each of the memory cells MT0 to MT7 is, for example, a transistor (for example, an Nch transistor) corresponding to the first conductivity type. In this case, the channel region 60 is formed of a semiconductor (for example, silicon) containing impurities (for example, boron) having a second conductivity type (for example, P-type) which is opposite to the first conductivity type. The source region 40 is formed of a semiconductor (for example, silicon) containing a first conductivity type (for example, N-type) impurities (for example, phosphorus, arsenic) at a concentration higher than a concentration of the second conductivity type (for example, P-type) impurities of the channel region 60. The drain region 50 is formed of a semiconductor (for example, silicon) containing a first conductivity type (for example, N-type) impurities (for example, phosphorus, arsenic) at a concentration higher than the concentration of second conductivity type (for example, P-type) impurities of the channel region 60.

For example, in the case where the charge storage region 32 is a floating gate electrode and the electric charges which are to be written in the charge storage region 32 are electrons corresponding to the N type, the charge storage region 32 may be formed of a polysilicon (non-dope polysilicon) not containing impurities, or the charge storage region 32 may be formed of a polysilicon containing P-type impurities (for example, boron) at a concentration of $1 \times 10^{19}/cm^3$ or less. In addition, the control gate 34 may be formed of a polysilicon (P+ polysilicon) containing P-type impurities at a concentration higher than the concentration of the P-type impurities of the channel region 60, or the control gate 34 may be formed of a polysilicon (N+ polysilicon) containing N-type impurities (for example, phosphorus, arsenic) at a concentration higher than the concentration of the P-type impurities of the channel region 60.

In addition, each of the selection gates DT and ST is, for example, one transistor. Each of the NAND strings NS1 to NS12 is configured so that the selection gate DT is connected in series to the memory cell MT7 which is at the most drain side among the memory cells MT0 to MT7 and the selection gate ST is connected in series to the memory cell MT0 which is at the most source side among the memory cells MT0 to MT7.

In addition, in the NAND strings NS1 to NS12, the word lines WL0 to WL7 are connected to the control gates 34 of the memory cells MT0 to MT7. In addition, one end of each of the NAND strings NS1 to NS12 is connected through the selection gate DT to each of the bit lines BL1 to BL12, and the other end of the NAND strings NS1 to NS12 is connected through the selection gate ST to the source line SL.

In addition, in the NAND strings NS1 to NS12, in the case where one bit is stored in one memory cell, for example, twelve memory cells MTk-1 to MTk-12 connected to the word line WLk (for example, k=0 to 7) can constitute one page PGE. In addition, for example, a memory cell connected to WL3 in NS1 is denoted by MT3-1. In addition, even in the case where a multiple-value of p bits (p is an integer of 2 or more) is stored in one memory cell, for example, twelve memory cells MTk-1 to MTk-12 connected to the word line WLk may constitute pages PGE of which maximum number is p.

Figure 3:
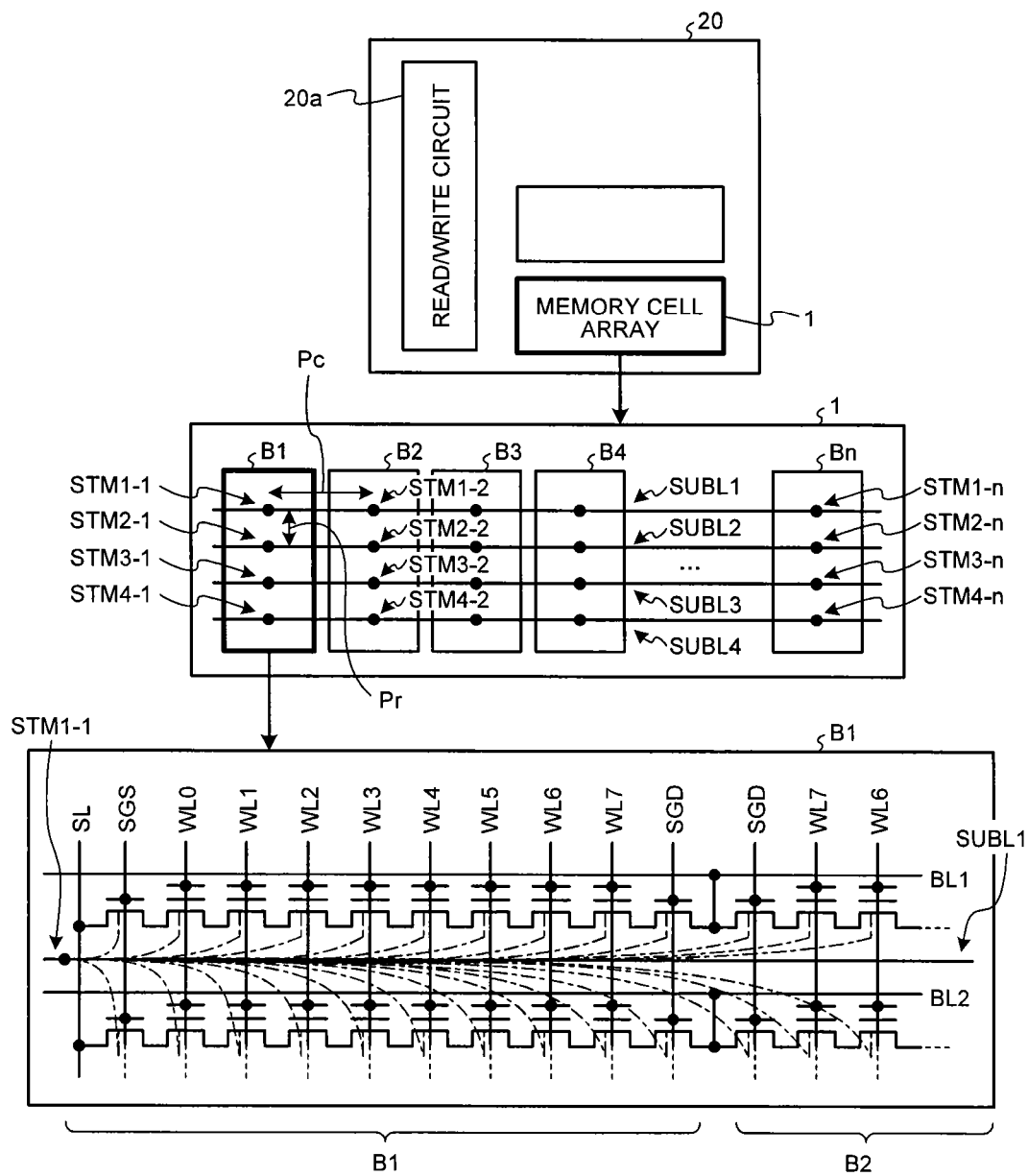
FIG. 3 is a diagram illustrating a configuration of a memory cell array according to the first embodiment.

Next, a configuration of the substrate contacts for supplying the back-gate voltage to the channel region of each memory cell will be described with reference to FIGS. 2 and 3. FIG. 3 is a diagram illustrating a layout configuration of substrate contacts of the memory cell array 1.

As illustrated in the upper figure of FIG. 3, the memory cell array 1 is disposed on the memory chip 20, and a read/write circuit region 20a where the row decoder 3, the column decoder 4, the well/source line potential control circuit 8, and the like are disposed is installed around the memory cell array 1.

In addition, as illustrated in the middle figure of FIG. 3, the plurality of the blocks B1 to Bn are disposed in the memory cell array 1, for example, in the column direction (that is, the direction along the bit line). A plurality of substrate contacts STM1 to STM4 are installed in each of the blocks B1 to Bn.

For example, a plurality of substrate contacts STM1-1 to STM4-1 are installed in the block B1. For example, a plurality of substrate contacts STM1-n to STM4-n are installed in the block Bn. In other words, when seeing the memory cell array 1 in its entirety, the plurality of the substrate contacts STM1-1 to STM4-n are arranged in the row direction and the column direction. With respect to the arrangement of the plurality of the substrate contacts STM1-1 to STM4-n, the substrate contacts are repetitively arranged in the row direction with a pitch Pr, and the substrate contacts are repetitively arranged in the column direction with a pitch Pc.

For example, as illustrated in FIG. 2, in the block B1, the substrate contacts STM1 to STM4 are arranged to correspond to the case where the substrate contacts are arranged one time in the column direction and the substrate contacts are repetitively arranged four times in the row direction. In other words, in the case illustrated in FIG. 2, the pitch Pr of the substrate contacts in the column direction is equivalent to the pitch of the blocks in the column direction, and as seen in the column direction, substrate contacts are arranged one time with respect to one block. In addition, the pitch of the substrate contacts in the row direction is about three times the pitch of the bit lines, and as seen in the row direction, substrate contacts are arranged one time with respect to three bit lines.

In addition, although the case where substrate contacts are arranged one time with respect to three bit lines is exemplified for simplifying the description, in an actual case, substrate contacts may be arranged one time with respect to, for example, hundreds to thousands of the bit lines.

With respect to arrangement positions of the substrate contacts in the block, for example, as illustrated in FIG. 2, the substrate contacts may be installed at positions which are adjacent to the side far from, for example, the NAND strings NS1 to NS12 with respect to the source line SL. Accordingly, as illustrated by one-dot dashed lines in a lower figure of FIG. 3, each of the substrate contacts STM1 to STM4 is commonly connected to the channel regions of the plurality of the memory cells of the plurality of the strings via the semiconductor substrate SB (refer to FIG. 18).

In addition, as illustrated in the middle figure of FIG. 3, the plurality of the substrate voltage lines SUBL1 to SUBL4 are extended in the column direction respectively and arrayed in the row direction. In other words, each of the substrate voltage lines SUBL1 to SUBL4 is extended along a bit line between a plurality of the bit lines over the plurality of the blocks B1 to Bn and is connected to a corresponding substrate contact.

For example, the substrate voltage line SUBL1 is extended along the bit line over the plurality of the blocks B1 to Bn and is connected to the substrate contacts STM1-1 to STM1-n. For example, the substrate voltage line SUBL2 is extended along the bit line over the plurality of the blocks B1 to Bn and is connected to the substrate contacts STM2-1 to STM2-n. For example, the substrate voltage line SUBL3 is extended along the bit line over the plurality of the blocks B1 to Bn and is connected to the substrate contacts STM3-1 to STM3-n. For example, the substrate voltage line SUBL4 is extended along the bit line over the plurality of the blocks B1 to Bn and is connected to the substrate contacts STM4-1 to STM4-n.

Arrangement positions of the substrate voltage lines SUBL1 to SUBL4 in the blocks B1 to Bn are illustrated in, for example, FIG. 2. For example, the substrate voltage line SUBL1 is extended along the bit line BL1 between the bit line BL1 and the bit line BL2 and is connected to the substrate contact STM1. For example, the substrate voltage line SUBL2 is extended along the bit line BL4 between the bit line BL4 and the bit line BL5 and is connected to the substrate contact STM2. For example, the substrate voltage line SUBL3 is extended along the bit line BL7 between the bit line BL7 and the bit line BL8 and is connected to the substrate contact STM3. For example, the substrate voltage line SUBL4 is extended along the bit line BL10 between the bit line BL10 and the bit line BL11 and is connected to the substrate contact STM4.

Figure 18:
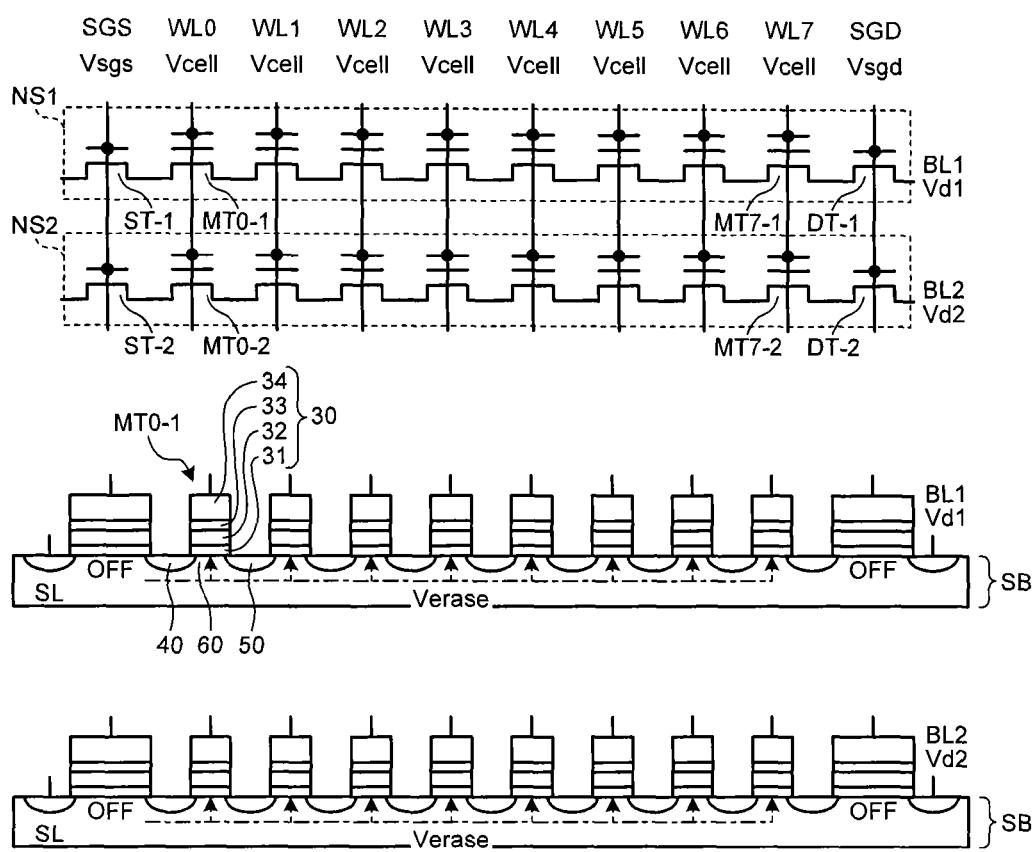
FIG. 18 is a diagram illustrating operations of a memory cell array according to a comparative example.

Herein, the case where, in the erase operation where electric charges written in the charge storage region 32 of each of the memory cells in the block B1 are extracted to the channel region 60, the voltage which is to be applied between the control gate 34 and the channel region 60 is maintained at a constant level will be considered. In this case, the control unit 13a (refer to FIG. 1) controls, for example, as illustrated in FIG. 18. FIG. 18 is a diagram illustrating operations of the memory cell array 1 in a comparative example.

Figure 4A:
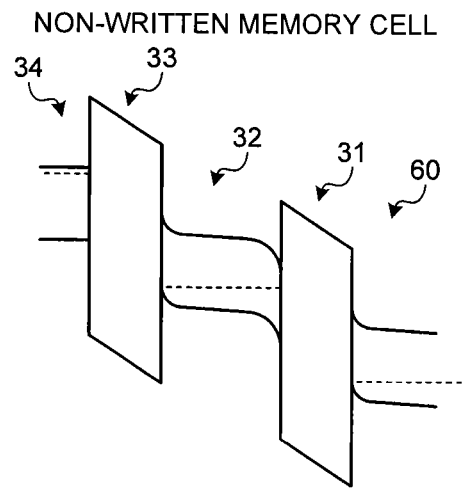
FIGS. 4A to 4C are diagrams illustrating operations of a memory cell array according to the first embodiment.
Figure 4B:
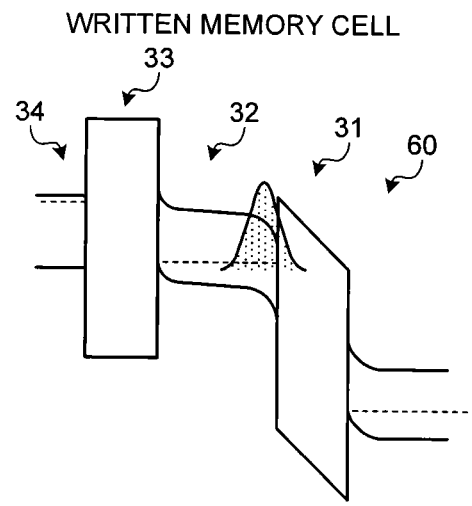
Figure 4C:
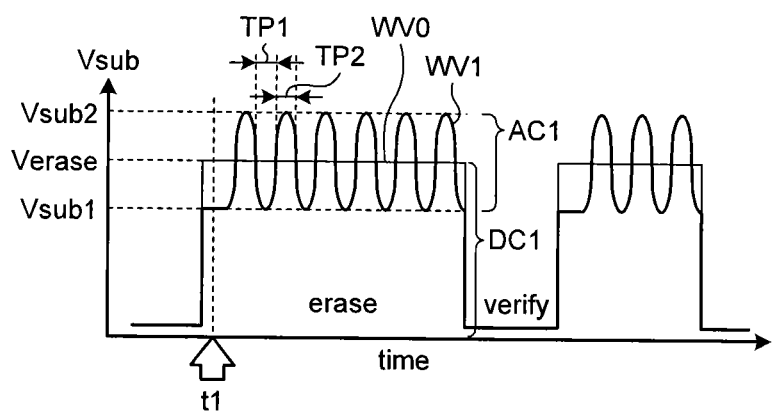

More specifically, as illustrated in FIG. 18, the control unit 13a sets the voltage which is to be supplied to the substrate contacts STM1-1 to STM4-1 (refer to FIG. 3) to Verase which is maintained at a constant level (for example, 20 V) (refer to the waveform WV0 of FIG. 4C). Accordingly, the control unit 13a maintains the back-gate voltage with respect to the plurality of the memory cells of plurality of the NAND strings NS1 to NS12 at a constant level through the substrate contacts STM1-1 to STM4-1.

Figure 11:
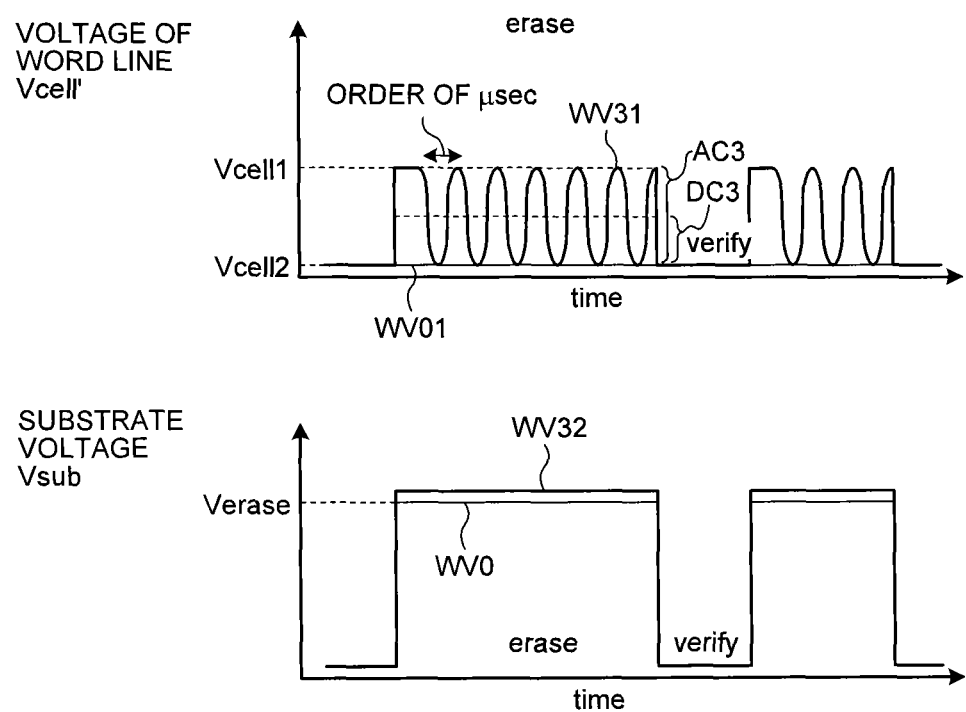
FIG. 11 is a diagram illustrating operations of a memory cell array according to the third embodiment.

In addition, the control unit 13a sets the voltages of each of the bit lines BL1 to BL12 and the voltages Vsgs and Vsgd of the selection gate lines SGS and SGD to OPEN or a level equivalent to Verase and sets the voltages of the plurality of the word lines WL0 to WL7 to Vcell which is maintained at a constant level (for example, 0 V) (refer to the waveform WV01 of FIG. 11). Alternatively, the control unit 13a applies, one time, a pulse-shaped voltage, which is maintained at a constant level (for example, 0 V) for a predetermined time period, to the plurality of the word lines WL0 to WL7. Accordingly, the control unit 13a maintains the gate voltage with respect to the plurality of the memory cells of the plurality of the strings NS1 to NS12 at a constant level at least for a predetermined time period through the plurality of the word lines WL0 to WL7.

Figure 19A:
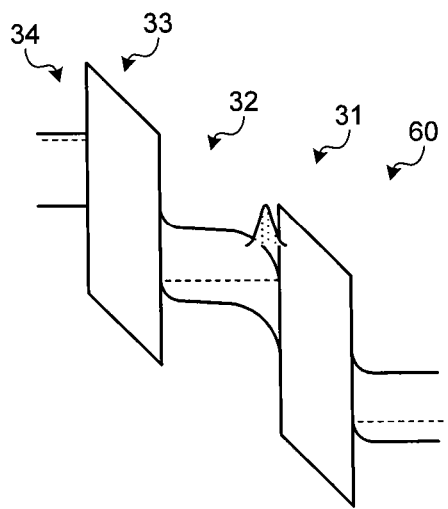
FIGS. 19A and 19B are diagrams illustrating operations of a memory cell array according to a comparative example.
Figure 19B:
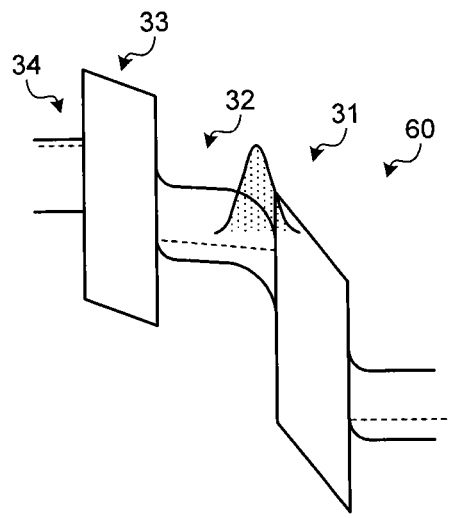

In this case, there is a possibility in that the problems illustrated in FIGS. 19A and 19B occur. FIG. 19A is a band diagram illustrating a state of a non-written memory cell in an erase operation, and FIG. 19B is a band diagram illustrating a state of a written memory cell in an erase operation.

In the erase operation, the gate voltage corresponding to the aforementioned Vcell is applied to the control gate 34 of each of the memory cells, and the back-gate voltage corresponding to the aforementioned Verase is applied to the channel region 60 of each of the memory cells. The back-gate voltage and the gate voltage are set by taking the written memory cell illustrated in FIG. 19B into consideration as a reference. In other words, among a plurality of the memory cells in the block B1, in the memory cell (written memory cell) where electric charges are written in the charge storage region 32, as illustrated in FIG. 19B, a band bending is increased according to a voltage difference between the back-gate voltage applied to the channel region 60 and the gate voltage applied to the control gate 34, and the electric charges written in the charge storage region 32 are extracted through the tunnel insulating film 31 to the channel region 60.

In this case, among a plurality of the memory cells in the block B1, in the memory cell (non-written memory cell) where electric charges are not written in the charge storage region 32, as illustrated in FIG. 19A, a band bending is increased according to a voltage difference between the back-gate voltage applied to the channel region 60 and the gate voltage applied to the control gate 34, and electric charges of minority carriers (where, in this embodiment, minority carrier is electron in p-type polysilicon floating gate.) in the charge storage region 32 have a tendency to be gradually collected in the interface between the charge storage region 32 and the tunnel insulating film 31 in the charge storage region 32. Accordingly, in the non-written memory cell illustrated in FIG. 19A, although the electric charges are not written in the charge storage region 32, an inversion layer may be formed in the charge storage region 32 and electric charges may flow out. Therefore, the flowing-out electric charges may be extracted through the tunnel insulating film 31 to the channel region 60. In other words, since the electric charges are extracted from the non-written memory cell, the memory cell is in an over-erased state.

In the memory cell which is in the over-erased state, since the number of minority carriers in the charge storage region 32 is insufficient in comparison with an equilibrium state, when electric charges are written in the charge storage region 32 later, there is a need to write a larger amount of electric charges through the tunnel insulating film 31 in the charge storage region 32. Accordingly, since an excessive amount of electric charges pass through the tunnel insulating film 31 of the memory cell, stress which is larger than necessary stress may be exerted to the tunnel insulating film 31 of the memory cell, the tunnel insulating film may be deteriorated. Therefore, deterioration in the reliability of various types of operations of the non-volatile semiconductor storage device 100 may be precipitated.

Therefore, in the first embodiment, as illustrated in FIGS. 4A to 6C, during the erase operation where electric charges written in the charge storage region 32 of each of the memory cells in the to-be-erased block B1 are extracted to the channel region 60, control of periodically varying the voltage which is to be applied between the control gate 34 and the channel region 60 is performed, so that the electric field is alleviated before the electric charges flow out in the non-written memory cell and the over-erasing is suppressed. FIGS. 4A to 6C are diagrams illustrating the operations of the memory cell array 1 according to the first embodiment. Hereinafter, in an erase process where the erase operation and the verify operation are alternately performed several times, one erase operation will be mainly described.

More specifically, as illustrated in FIG. 4C, the control unit 13a (refer to FIG. 1) periodically varies the substrate voltage Vsub which is to be supplied to the substrate contacts STM1-1 to STM4-1 (refer to FIG. 3). Accordingly, the control unit 13a periodically varies the back-gate voltages with respect to the plurality of the memory cells of plurality of the NAND strings NS1 to NS12 through the substrate contacts STM1-1 to STM4-1.

In addition, the control unit 13a sets the voltages of the plurality of the word lines WL0 to WL7 to Vcell which is maintained at a constant level (for example, 0 V) and sets the voltages Vsgs and Vsgd of the selection gate lines SGS and SGD to an OPEN state or Verase. Alternatively, the control unit 13a applies, one time, a pulse-shaped voltage which is maintained at a constant level (for example, 0 V) to each of the plurality of the word lines WL0 to WL7 for a predetermined time interval. Accordingly, the control unit 13a maintains the gate voltage with respect to the plurality of the memory cells of the plurality of the strings NS1 to NS12 at a constant level at least for a predetermined time interval through the plurality of the word lines WL0 to WL7.

In other words, with respect to each of the to-be-erased memory cells, the control unit 13a maintains the gate voltage which is to be applied to the control gate 34 at a constant level and periodically varies the back-gate voltage which is to be applied to the channel region 60. Accordingly, the control unit 13a periodically varies the voltage which is to be applied between the control gate 34 and the channel region 60.

More specifically, as illustrated in FIG. 4C, the control unit 13a periodically varies the substrate voltage Vsub which is to be supplied to the substrate contacts STM1-1 to STM4-1 (refer to FIG. 3) between the level Vsub1 and the level Vsub2. The level Vsub1 is a level determined so that electric charges written in the charge storage region 32 are not extracted to the channel region 60 with respect to each of the memory cells of the to-be-erased block, and is a level lower than, for example, Verase (for example, 20 V). The level Vsub2 is a level determined so that electric charges written in the charge storage region 32 are extracted to the channel region 60 with respect to each of the memory cells of the to-be-erased block, and is a level higher than, for example, Verase (for example, 20 V) or a level equivalent to Verase (for example, 20 V).

Accordingly, with respect to each of the memory cells of the to-be-erased block B1, the control unit 13a maintains the gate voltage Vg which is to be applied to the control gate 34 at a constant level and periodically varies the back-gate voltage Vbg which is to be applied to the channel region 60 between the level (first level) Vbg1 and the level (second level) Vbg2. The level Vbg1 is a level corresponding to the level Vsub1 and is a level where electric charges written in the charge storage region 32 are not extracted to the channel region 60 with respect to each of the memory cells of the to-be-erased block. The level Vbg2 is a level corresponding to the level Vsub2 and is a level where electric charges written in the charge storage region 32 are extracted to the channel region 60 with respect to each of the memory cells of the to-be-erased block.

In other words, the control unit 13a periodically varies the voltage Vbgg, which is to be applied between the control gate 34 and the channel region 60, between the level (first level) Vbgg1 and the level (second level) Vbgg2. The level Vbgg1 is a level corresponding to the level Vsub1 and the level Vbg1 and is a level where electric charges written in the charge storage region 32 are not extracted to the channel region 60 with respect to each of the memory cells of the to-be-erased block. The level Vbgg2 is a level corresponding to the level Vsub2 and the level Vbg2 and is a level where electric charges written in the charge storage region 32 are extracted to the channel region 60 with respect to each of the memory cells of the to-be-erased block.

For example, as illustrated in FIG. 4C, the control unit 13a periodically varies the substrate voltage Vsub which is to be supplied to the substrate contacts STM1-1 to STM4-1 (refer to FIG. 3) so as to have the waveform WV1 where the AC component AC1 superimposes on the DC component DC1. The DC component DC1 has a substantially constant amplitude which is equivalent to, for example, the level Verase and has a substantially constant amplitude corresponding to a central value (Vbgg1+Vbgg2)/2 of the level (first level) Vbgg1 and the level (second level) Vbgg2. The AC component AC1 has a amplitude which is equivalent to, for example, a difference between the level Vsub1 and the level Vsub2 and has a amplitude corresponding to a difference between the level (first level) Vbgg1 and the level (second level) Vbgg2. The AC component AC1 is a sine-wave-shaped component illustrated in, for example, FIG. 4C.

Figure 9:
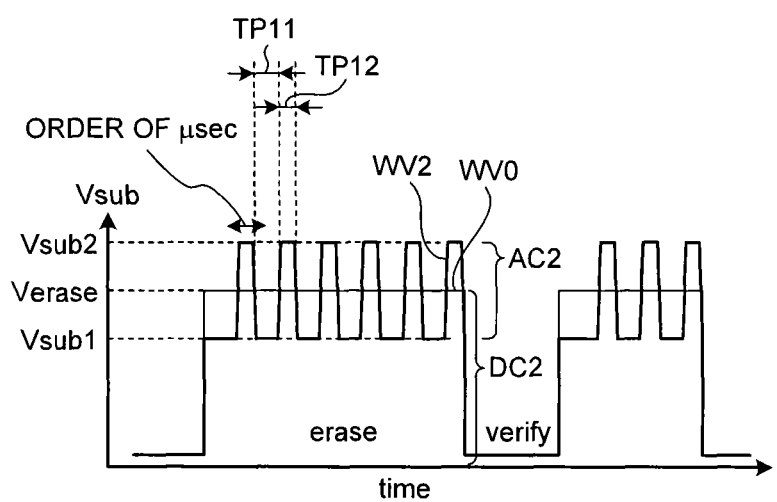
FIG. 9 is a diagram illustrating operations of a memory cell array according to a second embodiment.

In addition, instead of a sine-wave-shaped component, the AC component AC1 may be, for example, a periodic-pulse-shaped component (refer to FIG. 9). For example, in the case where the DC component DC1 has a one-pulse waveform, the AC component AC1 may have a periodic-pulse-shaped waveform having a period shorter than ½ of the period of the DC component DC1.

Next, a behavior of state of a memory cell according to control of the control unit 13a will be described in detail in time sequence.

At a timing t1 illustrated in FIG. 4C, the control unit 13a controls the substrate voltage Vsub which is to be supplied to the substrate contacts STM1-1 to STM4-1 (refer to FIG. 3) to be the level Vsub1 (for example, 15 V). In addition, the control unit 13a controls the voltages Vsgs and Vsgd of the selection gate lines SGS and SGD to be OPEN or a level equivalent to Verase and controls each of voltages of the plurality of the word lines WL0 to WL7 to be Vcell (for example, 0 V).

After the waiting in this state for a time (for example, 1 µsec), as illustrated in FIG. 4B, in the written memory cell, an inversion layer is formed in the region of the side of the tunnel insulating film 31 in the charge storage region 32. On the other hand, as illustrated in FIG. 4A, in the non-written memory cell, an inversion layer is not easily formed in the charge storage region 32.

Figure 5A:
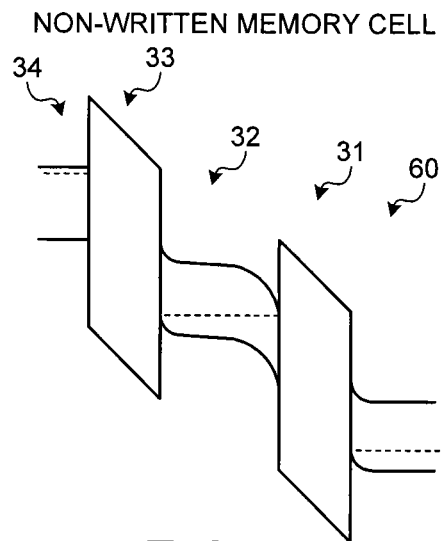
FIGS. 5A to 5C are diagrams illustrating operations of a memory cell array according to the first embodiment.
Figure 5B:
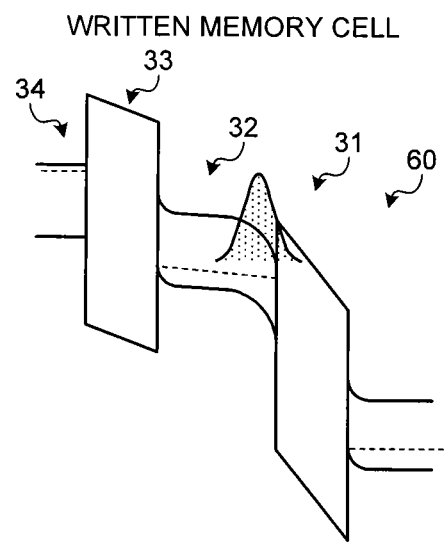
Figure 5C:
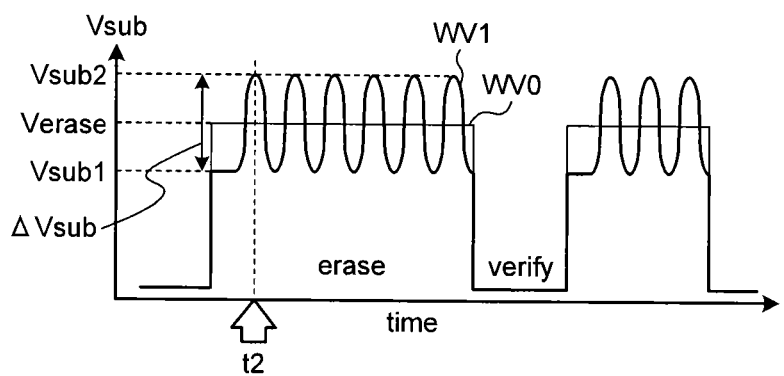

At a timing t2 illustrated in FIG. 5C, the control unit 13a control the substrate voltage Vsub which is to be supplied to the substrate contacts STM1-1 to STM4-1 (refer to FIG. 3) to be the level Vsub2 (for example, 20 V). In this case, as illustrated in FIG. 5B, in the written memory cell, electric charges (for example, electrons) are extracted from the inversion layer of the charge storage region 32 to the side of the channel region 60.

On the other hand, as illustrated in FIG. 5A, in the non-written memory cell, since the inversion layer is not easily formed in the charge storage region 32, electric charges (for example, electrons) are not easily extracted to the side of the channel region 60. A finite time (order of μsec) is need till electrons appear near interface between the charge storage region 32 and the tunnel insulating film 31 and inversion layer is created, after the substrate voltage Vsub is equivalent to or higher than Verase. Therefore, by controlling a length of a time period when the substrate voltage Vsub is equivalent to or higher than the level Verase to the finite time (order of μsec) of less, it is possible to suppress formation of an inversion layer in the charge storage region 32 of the non-written memory cell, and it is possible to suppress the tunnel current flowing from the charge storage region 32 to the tunnel insulating film 31 to a practically negligible level in comparison with the case the voltage which is to be applied between the control gate 34 and the channel region 60 is maintained at a constant level (refer to FIG. 18).

In other words, by controlling a length of a time period when the substrate voltage Vsub is equivalent to or higher than the level Verase to the finite time (order of μsec), the extraction of electric charges from the charge storage region 32 of the non-written memory cell is suppressed, and electric charges can be selectively extracted from the charge storage region 32 of the written memory cell.

Figure 6A:
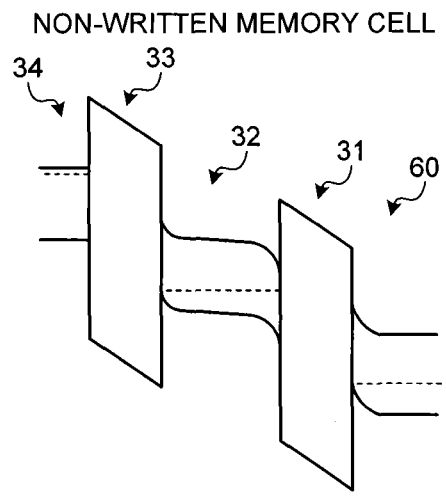
FIGS. 6A to 6C are diagrams illustrating operations of a memory cell array according to the first embodiment.
Figure 6B:
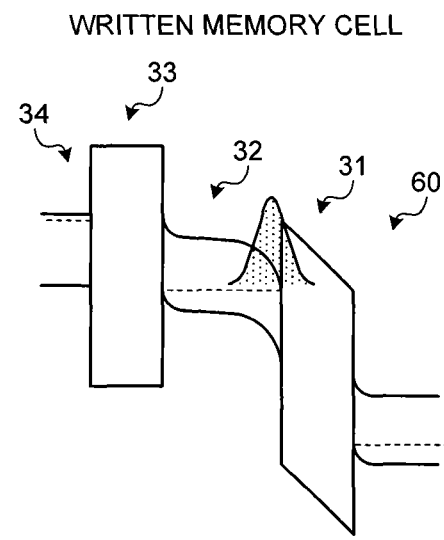
Figure 6C:
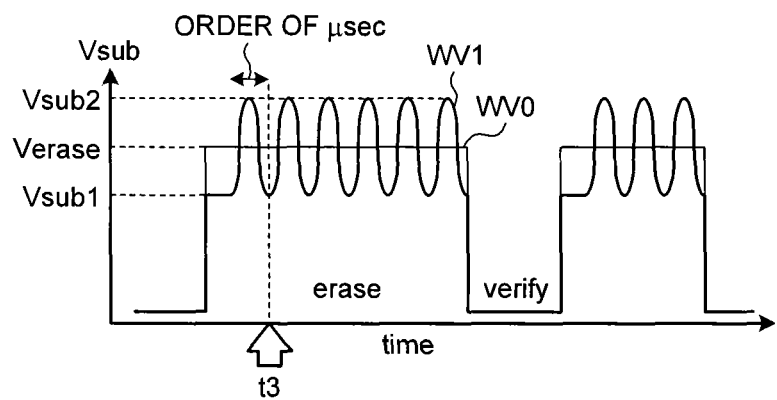

At a timing t3 illustrated in FIG. 6C, the control unit 13a controls the substrate voltage Vsub which is to be supplied to the substrate contacts STM1-1 to STM4-1 (refer to FIG. 3) so as to be returned to the level Vsub1 (for example, 15 V). In other words, as described above, if a finite time (order of μsec) elapses, electric charges (for example, electrons) are likely to slowly appear in the charge storage region 32 of the non-written memory cell. Before the time (for example, after 1 μsec), the substrate voltage Vsub is decreased down to the level Vsub1.

In other word, before the electric charges appear in the charge storage region 32 of the non-written memory cell, the electric field between the control gate 34 and the channel region 60 of each of the memory cells is alleviated, so that formation of an inversion layer in the charge storage region 32 of the non-written memory cell can be suppressed.

Hereinafter, these operations are repeated several times.

Figure 7:
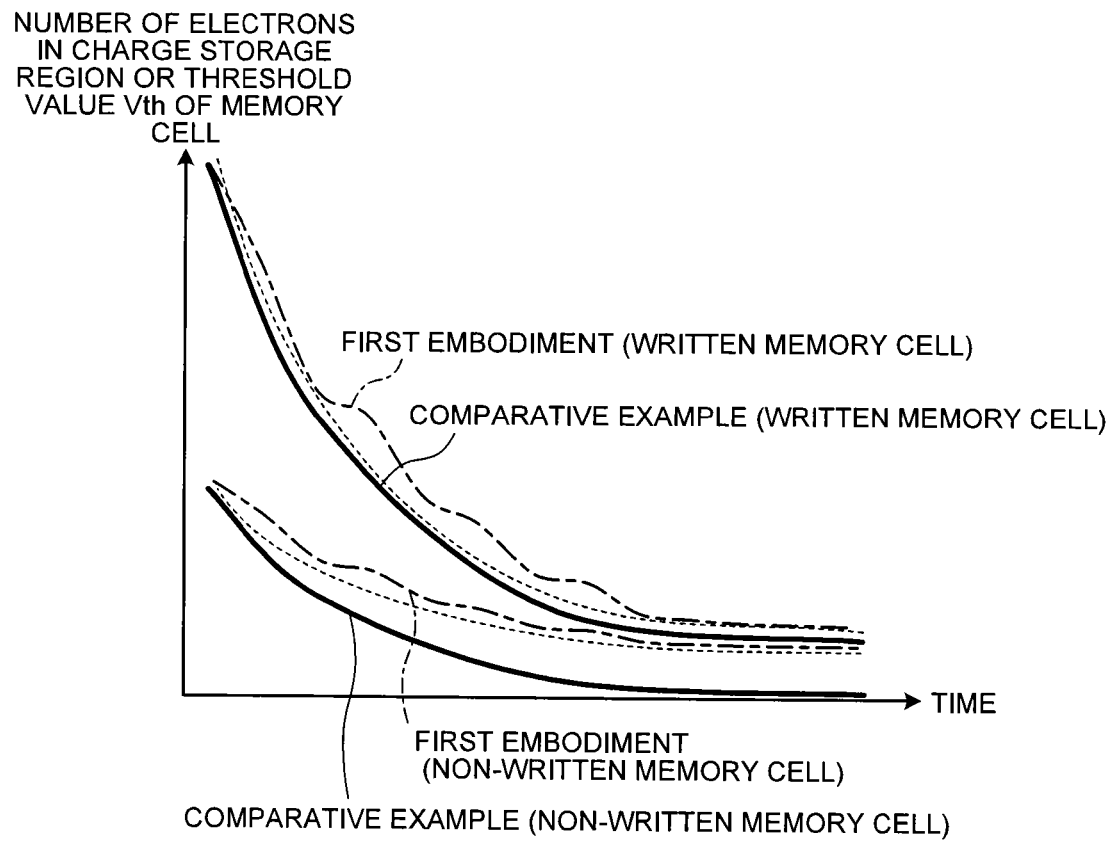
FIG. 7 is a diagram illustrating an effect according to the first embodiment.
Figure 8:
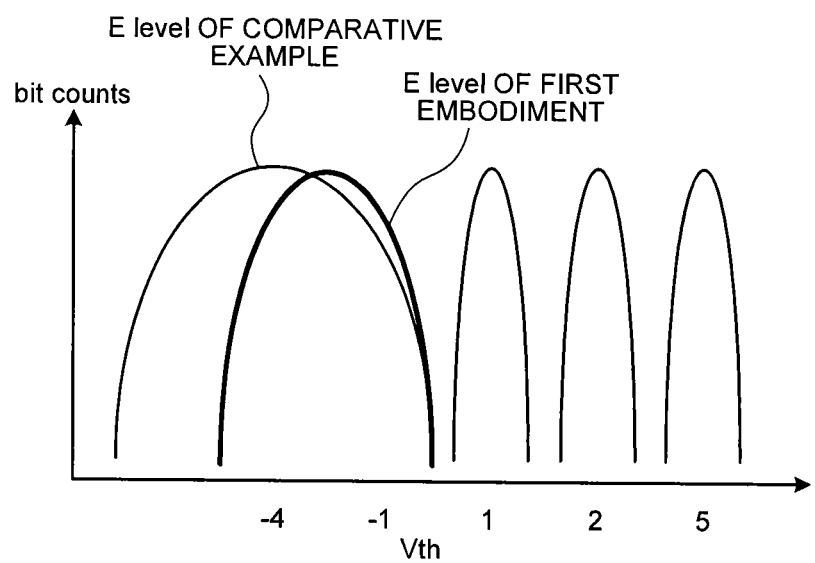
FIG. 8 is a diagram illustrating an effect according to the first embodiment.

Next, effects according to the first embodiment will be described with reference to FIGS. 7 and 8. FIGS. 7 and 8 are diagrams illustrating effects according to the first embodiment.

FIG. 7 is a diagram illustrating how the number of electrons in the charge storage region 32 or the threshold voltage Vth of the memory cell is changed according to the erase time of the erase operation with respect to a comparative example and the first embodiment. In the comparative example, since the electrons are also extracted from the non-written memory cell, as illustrated by solid lines in FIG. 7, the threshold voltage Vth of the non-written memory cell has a tendency to be greatly decreased during the erase operation in comparison with the written memory cell.

On the contrary, in the first embodiment, since the substrate voltage Vsub is periodically varied, the threshold voltage Vth is also changed in an undulating form indicated by one-dot dashed lines of FIG. 7; and however, the threshold voltage is decreased approximately in a log form indicated by broken lines of FIG. 7, so that a difference between the threshold voltage Vth of the written memory cell and the threshold voltage Vth of the non-written memory cell has a tendency to be decreased during the erase operation.

FIG. 8 is a diagram illustrating threshold voltage distribution of the memory cell of the non-volatile semiconductor storage device 100 in the case where multiple values, for example, four values (one value for the erased state and three values for written states) are to be written in the memory cell. In a comparative example, since the threshold voltage Vth of the non-written memory cell is also decreased (refer to FIG. 7), the threshold voltage Vth of the erased state has a large distribution in comparison with that of the written memory cell. Therefore, the threshold voltage is located at a lower voltage side with a large distribution (refer to "E level of comparative example" illustrated in FIG. 8).

On the contrary, in the first embodiment, since a difference between the threshold voltage Vth of the written memory cell and the threshold voltage Vth of the non-written memory cell has a tendency to be decreased (refer to FIG. 7), the width of the threshold voltage distribution in the erased state can be decreased in comparison with a comparative example (refer to an "E level of the first embodiment illustrated" in FIG. 8). Accordingly, it is possible to improve reliability of the non-volatile semiconductor storage device 100.

In this manner, in the first embodiment, in the non-volatile semiconductor storage device 100, during the erase operation where electric charges written in the charge storage region 32 are extracted to the channel region 60 with respect to each of the to-be-erased memory cells, the control unit 13a periodically varies the voltage which is to be applied between the control gate 34 and the channel region 60. Accordingly, in the non-volatile semiconductor storage device 100, during the erase operation, it is possible to suppress formation of an inversion layer in the charge storage region 32 of the non-written memory cell, and it is possible to suppress extraction of electrons from the non-written memory cell. As a result, since the occurrence of the case where the non-written memory cell is in the over-erased state can be reduced, when the electric charges are to be written to the charge storage region 32 of the memory cell later, an amount of the electric charges which are written in the charge storage region 32 through the tunnel insulating film 31 can be suppressed. Therefore, since passing of an excessive amount of electric charges through the tunnel insulating film 31 of the memory cell can be suppressed, stress exerted to the tunnel insulating film 31 of the memory cell can be suppressed, so that it is possible to improve reliability of various types of operations of the non-volatile semiconductor storage device 100.

In addition, in the first embodiment, since the width of the threshold voltage distribution of the erased state can be narrowed, variation of the threshold voltages Vth of the memory cells in the erased state can be reduced, so that the average threshold voltage Vth of the memory cells in the erased state can be defined as being higher. As a result, since the electric charges flowing through the tunnel insulating film 31 can be reduced, it is possible to improve reliability.

In addition, in the first embodiment, in the non-volatile semiconductor storage device 100, the control unit 13a periodically varies the voltage Vbgg, which is to be applied between the control gate 34 and the channel region 60, between the level Vbgg1 where the electric charges written in the charge storage region 32 are not extracted to the channel region 60 and the level Vbgg2 where the electric charges written in the charge storage region 32 are extracted to the channel region 60. Accordingly, since formation of an inversion layer in the charge storage region 32 of the non-written memory cell can be suppressed, it is possible to selectively extract electric charges from the charge storage region 32 of the written memory cell while suppressing extraction of electric charges from the charge storage region 32 of non-written memory cell.

In addition, in the first embodiment, the control unit 13a periodically varies the voltage which is to be applied between the control gate 34 and the channel region 60 so as to have the waveform WV1 where the sine-wave-shaped AC component AC1 having a amplitude corresponding to a difference between the level Vbgg1 and the level Vbgg2 superimposes on the DC component DC1 corresponding to the level Verase. Accordingly, it is possible to periodically vary the voltage which is to be applied between the control gate 34 and the channel region 60 between the level Vbgg1 and the level Vbgg2.

In addition, in the first embodiment, the control unit 13a maintains the gate voltage which is to be applied to the control gate 34 at a constant level and periodically varies the back-gate voltage which is to be applied to the channel region 60. Accordingly, it is possible to periodically vary the voltage which is to be applied between the control gate 34 and the channel region 60.

In addition, in the first embodiment, the control unit 13a periodically varies the back-gate voltage Vbg between the level Vbg1 where the electric charges written in the charge storage region 32 are not extracted to the channel region 60 and the level Vbg2 where the electric charges written in the charge storage region 32 are extracted to the channel region 60. Accordingly, it is possible to periodically vary the voltage Vbgg which is to be applied between the control gate 34 and the channel region 60 between the level Vbgg1 and the level Vbgg2.

Second Embodiment

Next, a non-volatile semiconductor storage device according to a second embodiment will be described with reference to FIG. 9. FIG. 9 is a diagram illustrating operations of a memory cell array according to the second embodiment. Hereinafter, different portions from the first embodiment will be mainly described.

In the first embodiment, the voltage which is to be applied between the control gate 34 and the channel region 60 is periodically varied so as to have a symmetric waveform where the time period TP1 of the level Vsub1 is equivalent to the time period TP2 of the level Vsub2. However, in the second embodiment, the voltage is periodically varied so as to have an asymmetric waveform.

More specifically, as illustrated in FIG. 9, the control unit 13a periodically varies the substrate voltage Vsub which is to be supplied to the substrate contacts STM1-1 to STM4-1 (refer to FIG. 3) so as to have an asymmetric waveform WV2 where a time period TP11 of the level Vsub1 is longer than a time period TP12 of the level Vsub2. Accordingly, the control unit 13a periodically varies the voltage which is to be applied between the control gate 34 and the channel region 60 so as to have an asymmetric wave form where the time period of the level Vbgg1 is longer than the time period of the level Vbgg2.

For example, as illustrated in FIG. 9, the control unit 13a periodically varies the substrate voltage Vsub which is to be supplied to the substrate contacts STM1-1 to STM4-1 (refer to FIG. 3) so as to have the waveform WV2 where the AC component AC2 superimposes on the DC component DC2. The DC component DC2 has a substantially constant amplitude which is equivalent to, for example, the level Verase and has a substantially constant amplitude corresponding to a intermediate value (Vbgg1+Vbgg2)/2 of the level (first level) Vbgg1 and the level (second level) Vbgg2. The AC component AC2 has a amplitude which is equivalent to, for example, a difference between the level Vsub1 and the level Vsub2 and has a amplitude corresponding to a difference between the level (first level) Vbgg1 and the level (second level) Vbgg2. The AC component AC2 is a periodic-pulse-shaped component having a duty ratio, for example, less than 50%.

In addition, instead of a periodic-pulse-shaped component, the AC component AC2 may be, for example, a sine-wave-shaped component (refer to FIG. 4C). For example, the AC component AC2 may have a waveform where a portion having a phase of 180° to 360° is selectively enlarged in the horizontal direction (time axis direction) by using the AC component AC1 illustrated in FIG. 4C as a basis. Alternatively, for example, the AC component AC2 may have a waveform where a portion having a phase of 0° to 180° is selectively shrunk in the horizontal direction (time axis direction) by using the AC component AC1 illustrated in FIG. 4C as a basis.

In this manner, in the second embodiment, the control unit 13a periodically varies the voltage which is to be applied between the control gate 34 and the channel region 60 so as to have an asymmetric waveform where a time period of the level Vbgg1 is longer than a time period of the level Vbgg2. Accordingly, in the non-written memory cell, since the time for dissipating the electric charges, which appear in the interface between the charge storage region 32 and the tunnel insulating film 31 in the charge storage region 32 for the time period of the level Vbgg2, can be secured, the formation of an inversion layer in the charge storage region 32 of the non-written memory cell can be more securely suppressed.

Third Embodiment

Next, a non-volatile semiconductor storage device according to a third embodiment will be described with reference to FIGS. 10 to 13. FIGS. 10 to 13 are diagrams illustrating operations of a memory cell array according to the third embodiment. Hereinafter, different portions from the first embodiment will be mainly described.

In the first embodiment, with respect to each of the memory cells of the to-be-erased block, the gate voltage is maintained at a constant level, and the back-gate voltage is periodically varied. However, in the third embodiment, the back-gate voltage is maintained at a constant level, and the gate voltage is periodically varied.

Figure 10:
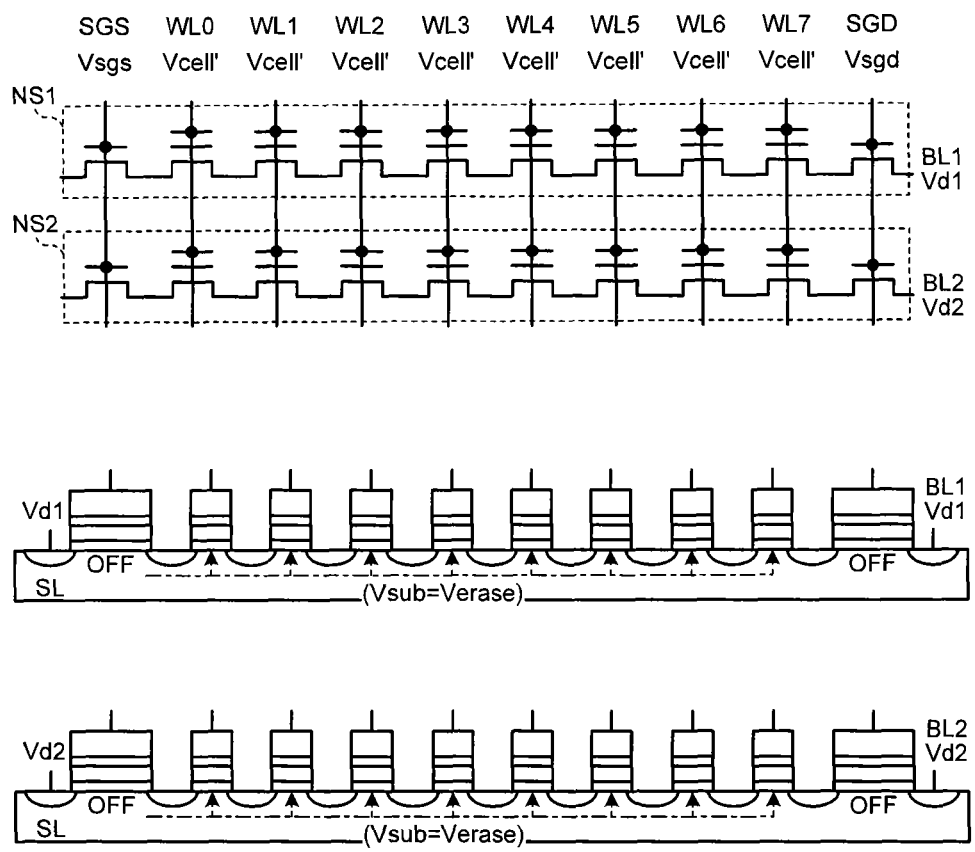
FIG. 10 is a diagram illustrating operations of a memory cell array according to a third embodiment.

More specifically, as illustrated in FIG. 10, the control unit 13a uniformly sets the substrate voltage Vsub which is to be supplied to the substrate contacts STM1-1 to STM4-1 (refer to FIG. 3) to be equivalent to Verase which is marinated at a constant level (for example, 20 V) (refer to the waveform WV32 of FIG. 11). Accordingly, the control unit 13a maintains the back-gate voltages with respect to the plurality of the memory cells of the plurality of the NAND strings NS1 to NS12 at a constant level through the substrate contacts STM1-1 to STM4-1.

In addition, the control unit 13a controls the voltages of the plurality of the word lines WL0 to WL7 to be Vcell' which is periodically varied (refer to the waveform WV31 of FIG. 11). In this case, although it is preferable that the control unit 13a control the voltages of the bit lines BL1 to BL12 (for example, the voltages Vd1 and Vd2 of the bit lines BL1 and BL2) and the voltages Vsgs and Vsgd of the selection gate lines SGS and SGD are set to OPEN or a level equivalent to Verase, even in the case where the voltages of the bit lines BL1 to BL12 and the voltages Vsgs and Vsgd of the selection gate lines SGS and SGD so as to be equivalent to the voltage of the word lines WL0 to WL7, that is, so as to be Vcell' which is periodically varied, the operation can be performed (even in the case where Vd1 and Vd2 are different from Vsgs and Vsgd, the operation can be performed).

Accordingly, the control unit 13a periodically varies the gate voltages with respect to the plurality of the memory cells of the plurality of the strings NS1 to NS12 through the plurality of the word lines WL0 to WL7.

In other words, with respect to each of the to-be-erased memory cells, the control unit 13a periodically varies the gate voltage which is to be applied to the control gate 34 and maintains the back-gate voltage which is to be applied to the channel region 60 at a constant level. Accordingly, the control unit 13a periodically varies the voltage which is to be applied between the control gate 34 and the channel region 60.

More specifically, as illustrated in FIG. 11, in the erase operation, the control unit 13a maintains the substrate voltage Vsub which is to be supplied to the substrate contacts STM1-1 to STM4-1 (refer to FIG. 3) at a level which is equivalent to the level Verase (for example, 20 V) and periodically varies the voltages Vcell' of the plurality of the word lines WL0 to WL7 corresponding to the to-be-erased block between the level Vcell and the level Vcell2. The level Vcell is a level determined so that electric charges written in the charge storage region 32 are not extracted to the channel region 60 with respect to each of the memory cells of the to-be-erased block, and is a level (for example, 5 V) higher than, for example, a level (for example, 0 V) of Vcell set as a comparative example. The level Vcell2 is a level determined so that electric charges written in the charge storage region 32 are extracted to the channel region 60 with respect to each of the memory cells of the to-be-erased block, and is a level equivalent to, for example, a level (for example, 0 V) of Vcell set as a comparative example.

Accordingly, with respect to each of the memory cells of the to-be-erased block B1, the control unit 13a periodically varies the gate voltage Vg which is to be applied to the control gate 34 between the level (first level) Vg1 and the level (second level) Vg2 and maintains the back-gate voltage Vbg which is to be applied to the channel region 60 at a constant level. The level Vg1 is a level corresponding to the level Vcell1 and is a level where electric charges written in the charge storage region 32 are not extracted to the channel region 60 with respect to each of the memory cells of the to-be-erased block. The level Vg2 is a level corresponding to the level Vcell2 and is a level where electric charges written in the charge storage region 32 are extracted to the channel region 60 with respect to each of the memory cells of the to-be-erased block.

For example, as illustrated in FIG. 11, the control unit 13a periodically varies the voltages Vcell' of the plurality of the word lines WL0 to WL7 so as to have the waveform WV31 where the AC component AC3 superimposes on the DC component DC3. The DC component DC3 has a substantially constant amplitude which is equivalent to, for example, intermediate value (Vcell1+Vcell2)/2 of the level Vcell1 and the level Vcell2 and has a substantially constant amplitude corresponding to an intermediate value (Vg1+Vg2)/2 of the level (first level) Vg1 and the level (second level) Vg2. The AC component AC3 has a amplitude which is equivalent to, for example, a difference between the level Vcell1 and the level Vcell2 and has a amplitude corresponding to a difference between the level (first level) Vg1 and the level (second level) Vg2. The AC component AC3 is, for example, a sine-wave-shaped component.

In addition, instead of a sine-wave-shaped component, the AC component AC3 may be, for example, a periodic-pulse-shaped component (refer to the AC component AC2 illustrated in FIG. 9).

In this manner, in the third embodiment, the control unit 13a periodically varies the gate voltage which is to be applied to the control gate 34 and maintains the back-gate voltage which is to be applied to the channel region 60 at a constant level. Accordingly, it is possible to periodically vary the voltage which is to be applied between the control gate 34 and the channel region 60.

In addition, in the third embodiment, since the gate voltage is periodically varied, in comparison with the case where the back-gate voltage is periodically varied, it is possible to improve responsiveness to fluctuation in the voltage which is to be applied between the control gate 34 and the channel region 60.

In addition, in the third embodiment, the control unit 13a periodically varies the gate voltage Vg between the level Vg1 where the electric charges written in the charge storage region 32 are not extracted to the channel region 60 and the level Vg2 where the electric charges written in the charge storage region 32 are extracted to the channel region 60. Accordingly, it is possible to periodically vary the voltage Vbgg which is to be applied between the control gate 34 and the channel region 60 between the level Vbgg1 and the level Vbgg2.

In addition, as a modified example, instead of controlling the voltages of the plurality of the word lines WL0 to WL7 corresponding to the to-be-erased block to have the same phase, the control unit 13a may control the voltages of the plurality of the word lines WL0 to WL7 to have different phases.

Figure 12:
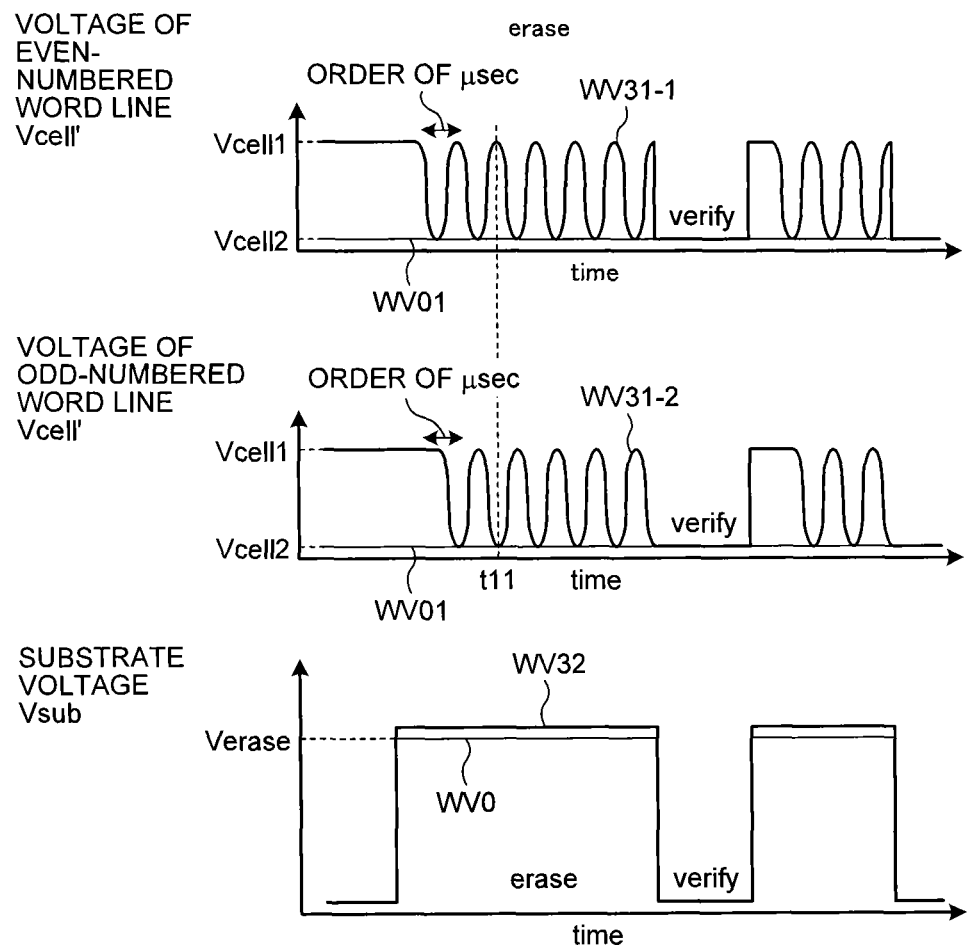
FIG. 12 is a diagram illustrating operations of a memory cell array according to a modified example of the third embodiment.

For example, in the case of a cell structure where a thickness of the charge storage region 32 (for example, a floating gate electrode) is relatively small so that coupling capacitance with respect to an adjacent word line does not cause serious problems, as illustrated in FIG. 12, the control unit 13a may control the voltages of the plurality of the word lines WL0 to WL7 so that the phases of the gate voltages between the adjacent word lines are shifted from each other by a half of a period. The phases of the voltages of, for example, the even-numbered word lines WL0, WL2, WL4, and WL6 and the phases of the voltages of, for example, the odd-numbered word lines WL1, WL3, WL5, and WL7 may be controlled so as to be shifted from each other by about a half of a period. In this case, for example, as seen at a timing t11, the phase of the waveform WV31-1 of the voltages of the even-numbered word lines WL0, WL2, WL4, and WL6 is shifted by about a half of a period from the phase of the waveform WV31-2 of the voltages of the odd-numbered word lines WL1, WL3, WL5, and WL7. The waveform WV31-1 and the waveform WV31-2 become waveforms which are shifted from each other by about a half of a period in the time axis direction.

Accordingly, it is possible to alleviate influence caused by trapping fixed electric charges in an insulating film (for example, an STI film for element isolation) near bottom of the charge storage region 32 (for example, a floating gate electrode).

Alternatively, as another modified example, with respect to the to-be-erased block B1, the control unit 13a may apply the back-gate voltages to the plurality of the memory cells of the plurality of the strings NS1 to NS12 through the substrate contacts STM1 to STM4 and may control the voltages of the plurality of the word lines WL0 to WL7 according to distances in the column direction from the substrate contacts STM1 to STM4 to the word lines WL0 to WL7.

For example, as illustrated in FIG. 3, distances from the substrate contact STM1-1 to the channel regions 60 of the memory cells controlled by the word lines WL0 to WL7 are also different according to the distances from the substrate contact STM1-1 to the word lines WL0 to WL7. For example, the distance to the nearest substrate contact STMT-1 is increased in the order of from the word line WL0 to the word line WL7. In this case, for example, as illustrated in FIG. 13, the back-gate voltage having the waveform WV32a which is substantially close to the substrate voltage Vsub is applied to the channel region 60 of the memory cell in the page corresponding to the word line WL0.

On the other hand, due to parasitic capacitance, the back-gate voltage having the waveform WV32b which is slightly more rounded than the waveform WV32a tends to be applied to the channel region 60 of the memory cell of the page corresponding to the word line WL3 which is further than the word line WL0 from the substrate contact STM1-1. Due to parasitic capacitance, the back-gate voltage having the waveform WV32c which is slightly more rounded than the waveform WV32b tends to be applied to the channel region 60 of the memory cell of the page corresponding to the word line WL5 which is further than the word line WL3 from the substrate contact STM1-1. Due to parasitic capacitance, the back-gate voltage having the waveform WV32d which is slightly more rounded than the waveform WV32c tends to be applied to the channel region 60 of the memory cell of the page corresponding to the word line WL7 which is further than the word line WL5 from the substrate contact STM1-1.

Therefore, the control unit 13a applies the voltage Vcell" with steep leading edge and tailing edge to the word line near the substrate contact and the voltage Vcell" with smooth leading edge and tailing edge to the word line far from the substrate contact, depending on the wave shape of the back-gate voltage.

Figure 13:
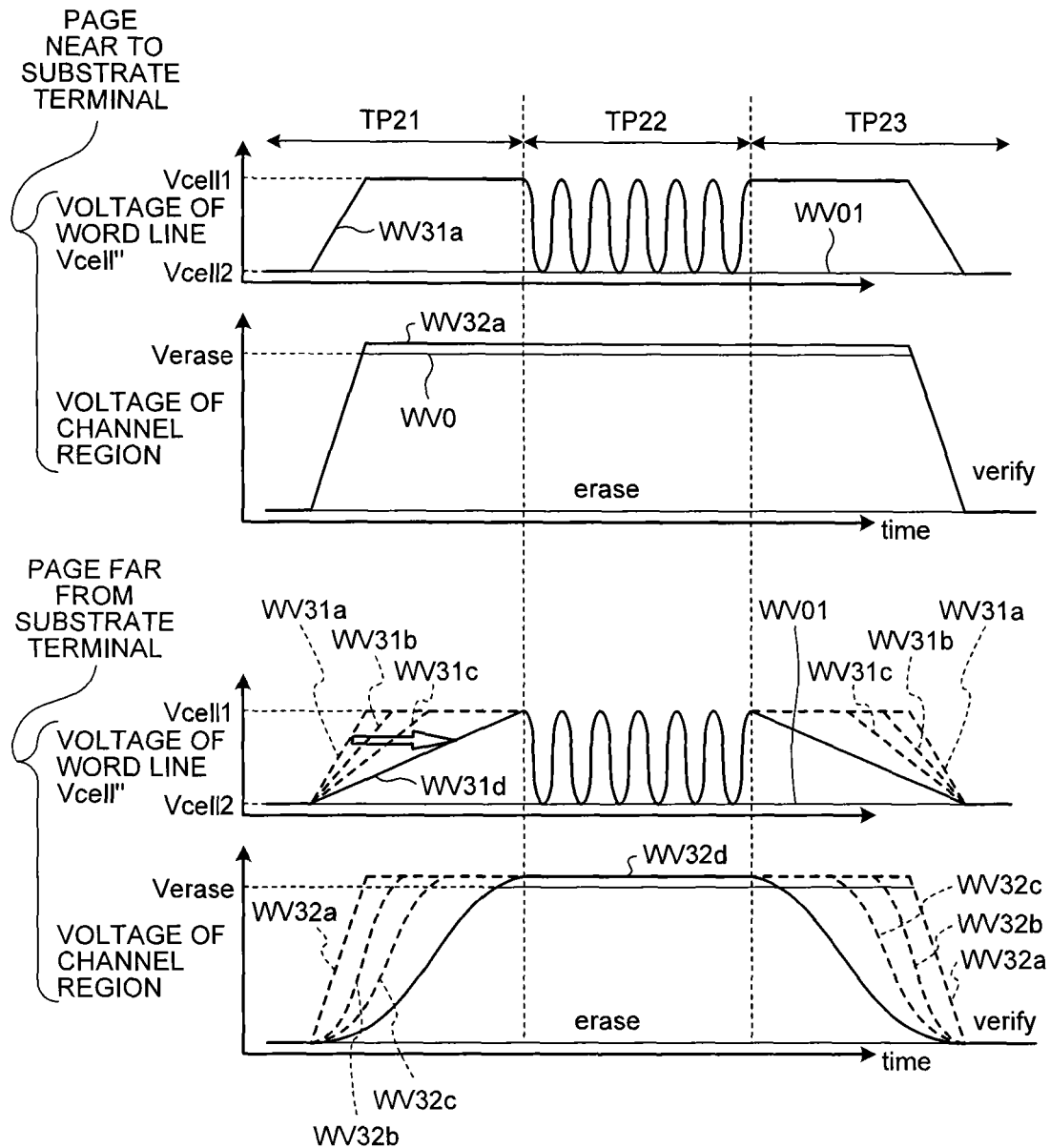
FIG. 13 is a diagram illustrating operations of a memory cell array according to another modified example of the third embodiment.

More specifically, as illustrated in FIG. 13, in the time period TP21, the control unit 13a increases the voltages of the plurality of the word lines so that the voltage of the word line far from the substrate contact is increased more slowly than the voltage of the word line near to the substrate contact. For example, in the time period TP21, the control unit 13a controls the voltage of the word line WL0 according to the waveform WV31a of which the rising edge is steep, controls the voltage of the word line WL3 according to the waveform WV31b of which the rising edge is more smooth, controls the voltage of the word line WL5 according to the waveform WV31c of which the rising edge is more smooth, and controls the voltage of the word line WL7 according to the waveform WV31d of which the rising edge is more smooth.

In the time period TP22, the control unit 13a periodically varies the voltages of the plurality of the word lines. For example, in the time period TP22, the control unit 13a periodically varies the voltages of the plurality of the word lines WL0 to WL7 according to similar waveform.

In the time period TP23, the control unit 13a increases the voltages of the plurality of the word lines so that the voltage of the word line far from the substrate contact is decreased more slowly than the voltage of the word line near to the substrate contact. For example, in the time period TP23, the control unit 13a controls the voltage of the word line WL0 according to the waveform WV31a of which the falling edge is steep, controls the voltage of the word line WL3 according to the waveform WV31b of which the falling edge is more smooth, controls the voltage of the word line WL5 according to the waveform WV31c of which the falling edge is more smooth, and controls the voltage of the word line WL7 according to the waveform WV31d of which the falling edge is more smooth.

Accordingly, since the variation of the number of electric charges (for example, electrons) appearing in the charge storage region 32 of each memory cell caused by delay of the substrate voltage Vsub can be suppressed, the width of the threshold voltage distribution of the erased state can be further reduced, so that it is possible to further improve reliability of the non-volatile semiconductor storage device 100.

Fourth Embodiment

Figure 14:
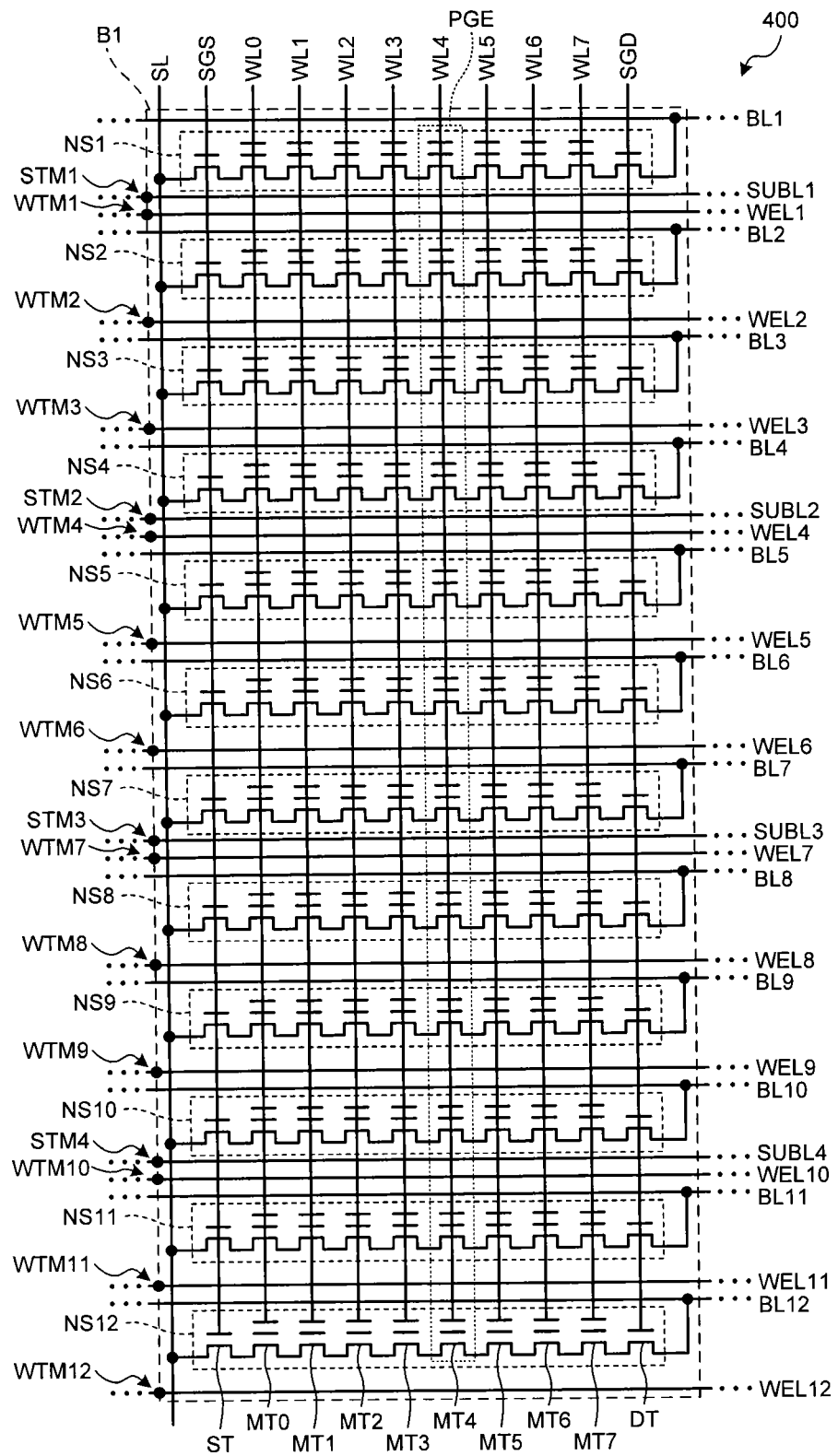
FIG. 14 is a diagram illustrating a configuration of a memory cell array according to a fourth embodiment.
Figure 15:
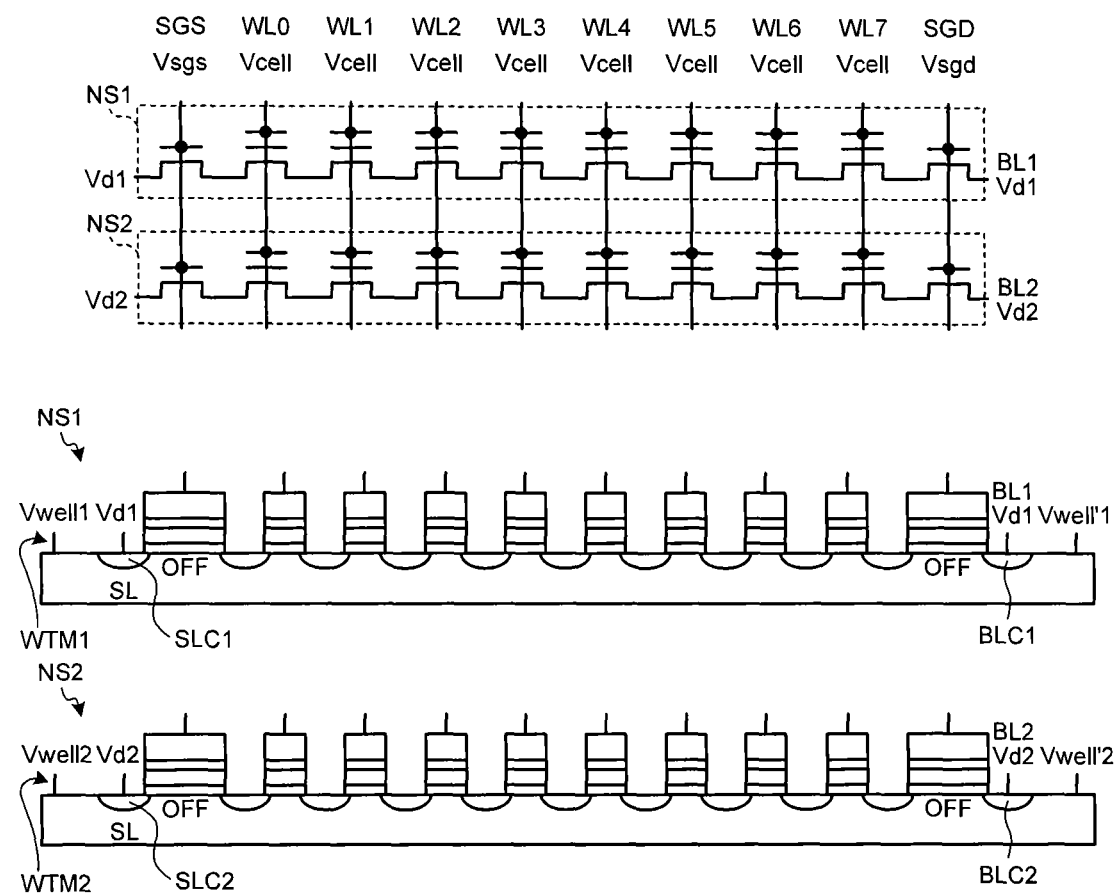
FIG. 15 is a diagram illustrating a configuration of a memory cell array according to the fourth embodiment.
Figure 16:
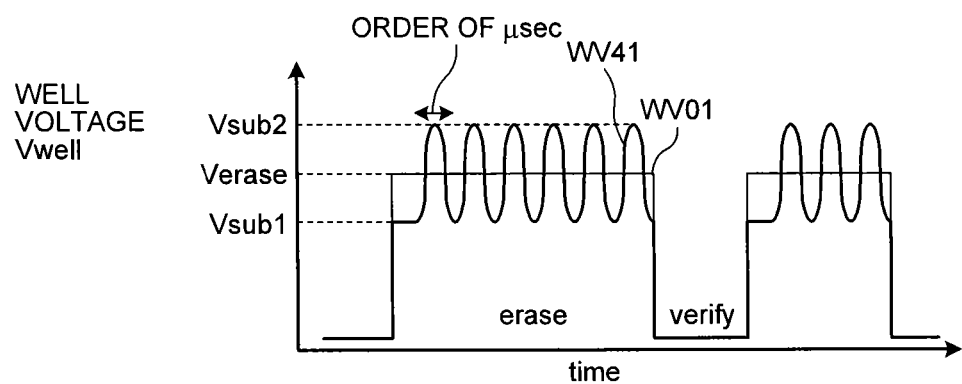
FIG. 16 is a diagram illustrating operations of a memory cell array according to the fourth embodiment.
Figure 16:
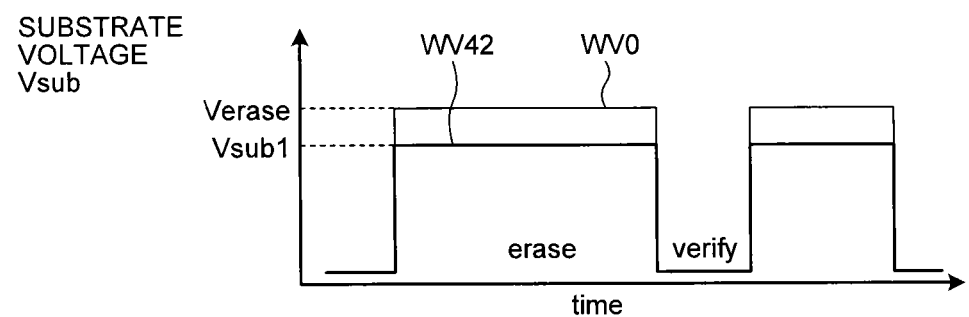
Figure 17:
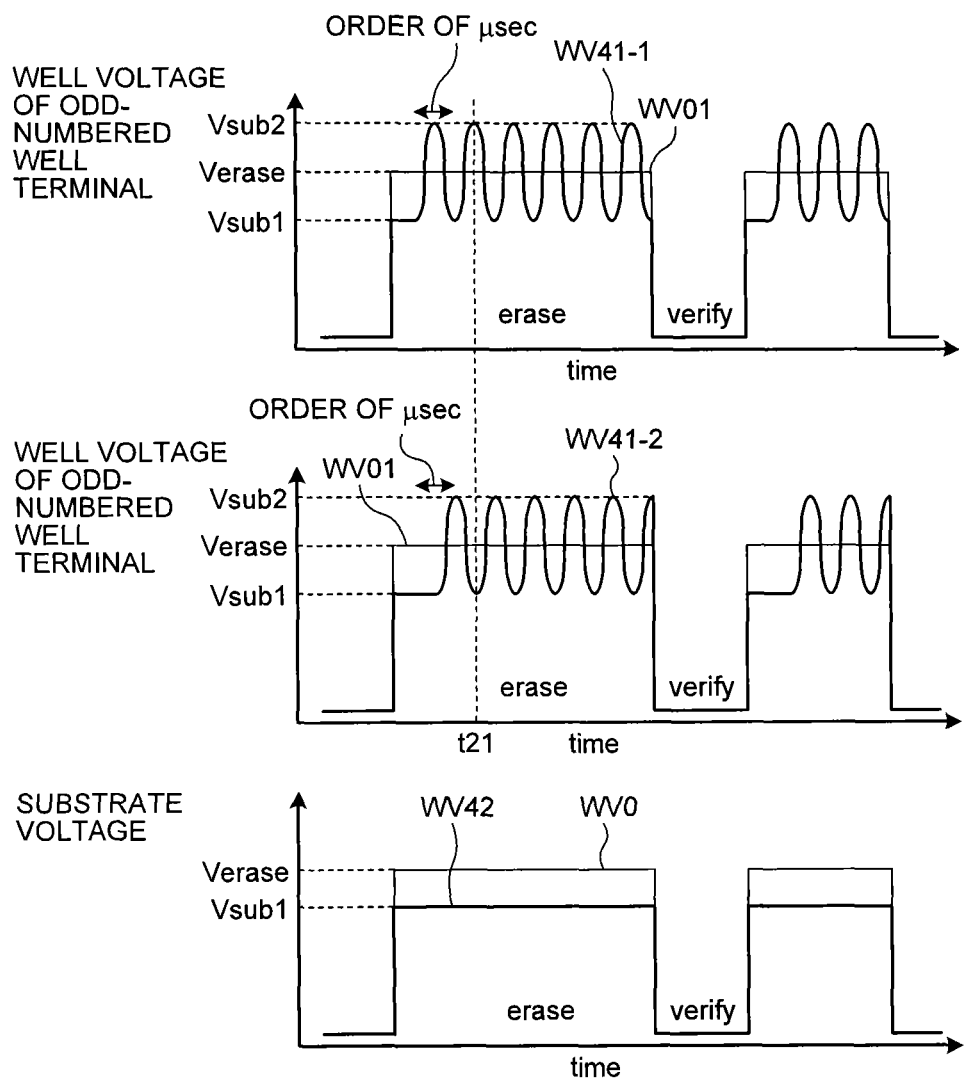
FIG. 17 is a diagram illustrating operations of a memory cell array according to a modified example of the fourth embodiment.

Next, a non-volatile semiconductor storage device 400 according to a fourth embodiment will be described with reference to FIGS. 14 to 17. FIGS. 14 and 15 are diagrams illustrating a configuration of a memory cell array according to the fourth embodiment. FIGS. 16 and 17 are diagrams illustrating operations of a memory cell array according to the fourth embodiment. Hereinafter, different portions from the first embodiment will be mainly described.

In the first embodiment, the substrate contacts for supplying the back-gate voltage to the channel region are commonly installed to the plurality of the strings. However, in the fourth embodiment, in addition to the common substrate contacts, the well contacts for supplying the back-gate voltage to the channel region are installed to each of the strings.

In the non-volatile semiconductor storage device 400, for example, as illustrated in FIG. 14, in the block B1, the well contacts WTM1 to WTM12 are arranged to correspond to the case where well contacts are arranged one time in the column direction and well contacts are repetitively arranged multiple times corresponds to the number of the NAND strings NS1 to NS12 in the row direction. In other words, in the case illustrated in FIG. 14, the pitch of the well contacts arranged in the column direction is equivalent to the pitch of the blocks in the column direction, and as seen in the column direction, well contacts are arranged one time with respect to one block. In addition, the pitch of the well contacts in the row direction is equivalent to the pitch of the bit lines, and as seen in the row direction, well contacts are arranged one time with respect to one bit line.

With respect to arrangement positions of the well contacts in the block, for example, as illustrated in FIG. 14, the well contacts for the NAND strings NS1 to NS12 may be installed on the other side of the source line SL from the NAND strings NS1 to NS12. Accordingly, for example, the well contact WTM1 is connected to the channel regions of the plurality of the memory cells of the NAND string NS1 in the semiconductor substrate SB. For example, the well contact WTM2 is connected to the channel regions of the plurality of the memory cells of the NAND string NS2 in the semiconductor substrate SB. For example, the well contact WTM12 is connected to the channel regions of the plurality of the memory cells of the NAND string NS12 in the semiconductor substrate SB. In this case, for example, the well contacts WTM1, WTM4, WTM7, and WTM10 may be installed at positions adjacent to the substrate contacts STM1, STM2, STM3, and STM4.

In addition, the plurality of the well voltage lines WEL1 to WEL12 are extended in the column direction and arrayed in the row direction. In other words, the well voltage lines WEL1 to WEL12 are extended along the bit lines BL1 to BL12 between the plurality of the bit lines BL1 to BL12 and the plurality of the substrate voltage lines SUBL1 to SUBL4 over the plurality of the blocks B1 to Bn (refer to FIG. 3) and are connected to the corresponding well contacts WTM1 to WTM12.

For example, the well voltage line WEL1 is extended along the bit line BL1 over the plurality of the blocks B1 to Bn and is connected to the well contact WTM1. For example, the well voltage line WEL2 is extended along the bit line BL2 over the plurality of the blocks B1 to Bn and is connected to the well contact WTM2. For example, the well voltage line WEL12 is extended along the bit line BL12 over the plurality of the blocks B1 to Bn and is connected to the well contact WTM12.

Arrangement of the well voltage lines WEL1 to WEL12 in the block are illustrated in, for example, FIG. 14. For example, the well voltage line WEL1 is extended along the bit line BL1 among the bit line BL1, the substrate voltage line SUBL1, and the bit line BL2 and is connected to the well contact WTM1 in the vicinity of the position where the well voltage line WEL1 intersects the source line SL. For example, the well voltage line WEL2 is extended along the bit line BL2 between the bit line BL2 and the bit line BL3 and is connected to the well contact WTM2 in the vicinity of the position where the well voltage line WEL2 intersects the source line SL. For example, the well voltage line WEL11 is extended along the bit line BL11 between the bit line BL11 and the bit line BL12 and is connected to the well contact WTM11 in the vicinity of the position where the well voltage line WEL11 intersects the source line SL. For example, the well voltage line WEL12 is extended along the bit line BL12 at a position adjacent to the bit line BL12 and is connected to the well contact WTM12 in the vicinity of the position where the well voltage line WEL12 intersects the source line SL.

With respect to more specific arrangement of the well contacts WTM1 and WTM2 in the block, for example, as illustrated in FIG. 15, the positions may be in an outer side of the source line contacts SLC1 and SLC2. Accordingly, since the distance between the well contacts WTM1 and WTM2 and the corresponding NAND strings NS1 and NS2 can be allowed to be shorter than the distances between the substrate contact STM1 and the corresponding NAND strings NS1 and NS2, the delay of the well voltage applied via the well contacts WTM1 and WTM2 to each of the memory cells can be improved.

In addition, with respect to the arrangement positions of the well contacts WTM1 and WTM2, in addition to the outer side of the source line contacts SLC1 and SLC2 or instead of the outer side of the source line contacts SLC1 and SLC2, the well contacts WTM1 and WTM2 may be installed in an outer side of the bit line contacts BLC1 and BLC2 (refer to Vwell'1 and Vwell'2 of FIG. 15).

In addition, as illustrated in FIG. 16, the operations of the control unit 13a are different from those of the first embodiment as follows. In other words, as illustrated in FIG. 16, the control unit 13a periodically varies the well voltage Vwell which is to be supplied to the well contacts WTM1 to WTM12 (refer to FIG. 14) (refer to the waveform WV41 of FIG. 16). At this time, the control unit 13a may uniformly set the substrate voltage Vsub which is to be supplied to the substrate contacts STM1 to STM4 (refer to FIG. 14) to Vsub1 which is maintained at a constant level (for example, 15 V) (refer to the waveform WV42 of FIG. 16). Accordingly, while the control unit 13a supplies a reference potential of the back-gate voltage with respect to the plurality of the memory cells of the plurality of the NAND strings NS1 to NS12 through the substrate voltage Vsub, the control unit 13a periodically varies the back-gate voltage with respect to the plurality of the memory cells of the plurality of the NAND strings NS1 to NS12 through the plurality of the well contacts WTM1 to WTM12.

More specifically, as illustrated in FIG. 16, while the control unit 13a maintains the substrate voltage Vsub which is to be supplied to the substrate contacts STM1 to STM4 at the level Vsub1, the control unit 13a periodically varies the well voltage Vwell which is to be supplied to the well contacts WTM1 to WTM12 (refer to FIG. 14) between the level Vsub1 and the level Vsub2. The level Vsub1 is a level determined so that electric charges written in the charge storage region 32 are not extracted to the channel region 60 with respect to each of the memory cells of the to-be-erased block, and is a level lower than, for example, Verase (for example, 20 V). The level Vsub2 is a level determined so that electric charges written in the charge storage region 32 are extracted to the channel region 60 with respect to each of the memory cells of the to-be-erased block, and is a level higher than, for example, Verase (for example, 20 V) or a level equivalent to Verase (for example, 20 V).

Accordingly, with respect to each of the memory cells of the to-be-erased block B1, the control unit 13a maintains the gate voltage Vg which is to be applied to the control gate 34 at a constant level and periodically varies the back-gate voltage Vbg which is to be applied to the channel region 60 between the level (first level) Vbg1 and the level (second level) Vbg2. In other words, the control unit 13a periodically varies the voltage Vbgg, which is to be applied between the control gate 34 and the channel region 60, between the level (first level) Vbgg1 and the level (second level) Vbgg2.

In this manner, in the fourth embodiment, the plurality of the well contacts WTM1 to WTM12 are installed to correspond to the plurality of the NAND strings NS1 to NS12, and each of the well contacts WTM1 to WTM12 is connected to the channel regions of the plurality of the memory cells of the corresponding NAND strings NS1 to NS12 in the semiconductor substrate SB. Accordingly, since the distances between the well contacts WTM1 to WTM12 and the corresponding NAND strings NS1 to NS12 can be allowed to be shorter than the distance between the substrate contacts STM1 to STM4 and the NAND strings NS1 to NS12, the responsiveness to the well voltage Vwell supplied through the well contacts WTM1 to WTM12 in each of the memory cells can be improved.

In addition, in the fourth embodiment, the control unit 13a maintains the gate voltage with respect to the plurality of the memory cells of plurality of the NAND strings NS1 to NS12 through the plurality of the word lines WL0 to WL7 and periodically varies the back-gate voltage with respect to the plurality of the memory cells of the plurality of the NAND strings NS1 to NS12 through the plurality of the well contacts WTM1 to WTM12. Accordingly, with respect to each of the memory cells, it is possible to vary the voltage Vbgg which is to be applied between the control gate 34 and the channel region 60 with good responsiveness.

In addition, in the fourth embodiment, the control unit 13a periodically varies the back-gate voltage with respect to the plurality of the memory cells of the plurality of the strings NS1 to NS12 through the plurality of the substrate contacts STM1 to STM4 and the plurality of the well contacts WTM1 to WTM4. In other words, while the control unit 13a supplies a base potential of the back-gate voltage with respect to the plurality of the memory cells of plurality of the NAND strings NS1 to NS12 through the substrate voltage Vsub, the control unit 13a periodically varies the back-gate voltage with respect to the plurality of the memory cells of the plurality of the NAND strings NS1 to NS12 through the plurality of the well contacts WTM1 to WTM12. Accordingly, with respect to each of the memory cells, it is possible to apply stably alternating voltage Vbgg between the control gate 34 and the channel region 60.

In addition, in the fourth embodiment, as illustrated in FIG. 16, while the control unit 13a maintains the substrate voltage Vsub which is to be supplied to the substrate contacts STM1 to STM4 at the level Vsub1, the control unit 13a periodically varies the well voltage Vwell which is to be supplied to the well contacts WTM1 to WTM12 (refer to FIG. 14) between the level Vsub1 and the level Vsub2. Accordingly, with respect to each of the memory cells, it is possible to stably vary the voltage Vbgg, which is to be applied between the control gate 34 and the channel region 60, between the voltage Vbgg1 corresponding to the level Vsub1 and the voltage Vbgg2 corresponding to the level Vsub2 by setting the voltage Vbgg1 corresponding to the level Vsub1 as a reference.

In addition, as a modified example, instead of controlling the voltages of the plurality of the well contacts WTM1 to WTM12 corresponding to the to-be-erased block to have the same phase, the control unit 13a may control the voltages of the plurality of the well contacts WTM1 to WTM12 to have different phases.

For example, as illustrated in FIG. 17, the control unit 13a may control the voltages of the plurality of the well contacts WTM1 to WTM12 so that the phases of the back-gate voltages between the adjacent NAND strings are shifted from each other by a half of a period. The phase of the voltages of, for example, the even-numbered well contacts WTM2, WTM4, WTM6, WTM8, WTM10, and WTM12 and the phase of the voltages of, for example, the odd-numbered well contacts WTM1, WTM3, WTM5, WTM7, WTM9, and WTM11 may be controlled to be shifted from each other by about a half of a period. In this case, for example, as seen at a timing t21, the phase of the waveform WV41-1 of the voltages of the even-numbered well contacts WTM2, WTM4, WTM6, WTM8, WTM10, and WTM12 is shifted by about a half of a period from the phase of the waveform WV41-2 of the voltages of the odd-numbered well contacts WTM1, WTM3, WTM5, WTM7, WTM9, and WTM11. The waveform WV41-1 and the waveform WV41-2 become waveforms which are shifted from each other by about a half of a period in the time axis direction.

Accordingly, it is possible to alleviate influence caused by trapping fixed electric charges in an insulating film (for example, an STI film for element isolation) in the bottom of the charge storage region 32 (for example, a floating gate electrode).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
   a memory cell which has a gate electrode including a control gate and a charge storage region above a semiconductor substrate and which has a channel region under the gate electrode in the semiconductor substrate; and
   a control unit which, during an erase operation where electric charges written in the charge storage region are extracted to the channel region, periodically varies a voltage to be applied between the control gate and the channel region,
   the control unit periodically varying the to-be-applied voltage between a first level where electric charges are not extracted from a cell in an erased state to the channel region and a second level where electric charges are extracted from a written cell to the channel region.

2. The non-volatile semiconductor storage device according to claim 1, wherein
   the control unit periodically varies the to-be-applied voltage so as to have an asymmetric waveform where a time period of the first level is longer than a time period of the second level.

3. The non-volatile semiconductor storage device according to claim 1, wherein
   the control unit periodically varies the to-be-applied voltage so as to have a waveform where a sine-wave-shaped AC component having a amplitude corresponding to a difference between the first level and the second level superimposes on a DC component corresponding to a central value of the first level and the second level.

4. The non-volatile semiconductor storage device according to claim 1, wherein
   the control unit periodically varies the to-be-applied voltage so as to have a waveform where a periodic-pulse-shaped AC component having a amplitude corresponding to a difference between the first level and the second level superimposes on a DC component corresponding to a central value of the first level and the second level.

5. The non-volatile semiconductor storage device according to claim 1, wherein
   the control unit maintains a gate voltage which is to be applied to the control gate at a substantially constant level and periodically varies a back-gate voltage which is to be applied to the channel region.

6. The non-volatile semiconductor storage device according to claim 5, wherein
   the control unit periodically varies the back-gate voltage between a first level where electric charges are not extracted from a cell in an erased state to the channel region and a second level where electric charges are extracted from a written cell to the channel region.

7. The non-volatile semiconductor storage device according to claim 6, wherein
   the control unit periodically varies the back-gate voltage so as to have an asymmetric waveform where a time period of the first level is longer than a time period of the second level.

8. The non-volatile semiconductor storage device according to claim 5, wherein
   a plurality of strings each including a plurality of memory cells which are connected in series in a column direction are arranged in a row direction to constitute a block,
   a plurality of word lines extending in the row direction so as to intersect the strings are arranged in the column direction, each of the word lines being commonly connected to control gates of the memory cells which are aligned in the row direction in the block,
   a plurality of well contacts are installed to correspond to the strings, each of the well contacts being commonly connected to channel regions of the memory cells of a corresponding string among the strings in the semiconductor substrate, and during an erase operation where the block is set as a unit of erasing, the control unit maintains the gate voltage with respect to the memory cells of the strings at a substantially constant level through the word lines and periodically varies the back-gate voltage with respect to the memory cells of the strings through the well contacts.

9. The non-volatile semiconductor storage device according to claim 8, wherein
the control unit controls voltages of the well contacts so that phases of back-gate voltages between the adjacent strings are shifted from each other by a half of a period.

10. The non-volatile semiconductor storage device according to claim 8, wherein
a plurality of substrate contacts are arranged in the row direction, each of the substrate contacts corresponding to every multiple numbers of the strings arranged in the row direction and being commonly connected to channel regions of the memory cells of the every multiple numbers of the strings in the semiconductor substrate.

11. The non-volatile semiconductor storage device according to claim 10, wherein
a distance between each of the well contacts and a corresponding string among the strings is shorter than a distance between each of the substrate contacts and a corresponding string among the strings.

12. The non-volatile semiconductor storage device according to claim 11, wherein,
the control unit periodically varies the back-gate voltage between a first level where electric charges written in the charge storage region are not extracted from a cell in an erased state to the channel region and a second level where electric charges are extracted from a written cell to the channel region through the well contacts while maintaining voltages of the substrate contacts at a third level where electric charges are not extracted to the channel region.

13. The non-volatile semiconductor storage device according to claim 1, wherein
the control unit periodically varies a gate voltage which is to be applied to the control gate and maintains a back-gate voltage which is to be applied to the channel region at a substantially constant level.

14. The non-volatile semiconductor storage device according to claim 13, wherein
the control unit periodically varies the gate voltage between a first level where electric charges are not extracted from a cell in an erased state to the channel region and a second level where electric charges are extracted from a written cell to the channel region.

15. The non-volatile semiconductor storage device according to claim 14, wherein
the control unit periodically varies the gate voltage so as to have an asymmetric waveform where a time period of the first level is longer than a time period of the second level.

16. The non-volatile semiconductor storage device according to claim 13, wherein
a plurality of strings each including a plurality of memory cells which are connected in series in a column direction are arranged in a row direction to constitute a block,
a plurality of word lines extending in the row direction so as to intersect the strings are arranged in the column direction, each of the word lines being commonly connected to control gates of the memory cells which are aligned in the row direction in the block, and
during an erase operation where the block is set as a unit of erasing, the control unit periodically varies the gate voltage with respect to the memory cells of the strings through the word lines.

17. The non-volatile semiconductor storage device according to claim 16, wherein
the control unit controls voltages of the word lines so that phases of gate voltages between the adjacent word lines are shifted from each other by a half of a period.

18. The non-volatile semiconductor storage device according to claim 16, wherein
a substrate contact is commonly connected to the channel regions of the memory cells of the strings constituting the block in the semiconductor substrate, and
the control unit applies the back-gate voltage with respect to the memory cells of the strings through the substrate contact and controls voltages of the word lines according to distances from the substrate contact to the word lines in the column direction.

19. The non-volatile semiconductor storage device according to claim 18, wherein
the control unit increases the voltages of the word lines in a first time period so that a voltage of a word line which is far from the substrate contact is increased more slowly than a voltage of a word line which is near to the substrate contact, periodically varies the voltages of the word lines in a second time period, and decreases the voltages of the word lines in a third time period so that the voltage of the word line which is far from the substrate contact is decreased more slowly than the voltage of the word line which is near to the substrate contact.

* * * * *